United States Patent
Kao et al.

(10) Patent No.: US 11,842,929 B2
(45) Date of Patent: Dec. 12, 2023

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Kuei-Yu Kao, Hsinchu (TW); Shih-Yao Lin, New Taipei (TW); Chen-Ping Chen, Toucheng Township (TW); Chih-Chung Chiu, Hsinchu (TW); Chen-Yui Yang, Hsinchu (TW); Ke-Chia Tseng, Hsinchu (TW); Hsien-Chung Huang, Hsinchu (TW); Chih-Han Lin, Hsinchu (TW); Ming-Ching Chang, Hsinchu (TW); Chao-Cheng Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 278 days.

(21) Appl. No.: 17/461,184

(22) Filed: Aug. 30, 2021

(65) Prior Publication Data
US 2023/0060825 A1 Mar. 2, 2023

(51) Int. Cl.
*H01L 21/8234* (2006.01)
*H01L 29/66* (2006.01)
(Continued)

(52) U.S. Cl.
CPC ........... *H01L 21/823468* (2013.01); *H01L 21/823412* (2013.01); *H01L 21/823431* (2013.01);
(Continued)

(58) Field of Classification Search
CPC ..... H01L 21/823412; H01L 21/823431; H01L 21/823462; H01L 21/823468; H01L 21/823821; H01L 21/823857; H01L 21/823864; H01L 29/0673; H01L 29/42384; H01L 29/42392; H01L 29/66439; H01L 29/66545; H01L 29/6656; H01L 29/66742; H01L 29/66772; H01L 29/66795; H01L 29/775; H01L 29/785; H01L 29/78696; B82Y 10/00; B82Y 40/00
See application file for complete search history.

(56) References Cited

U.S. PATENT DOCUMENTS

2021/0217848 A1* 7/2021 Kim ................. H01L 29/42392

* cited by examiner

*Primary Examiner* — Cheung Lee
(74) *Attorney, Agent, or Firm* — FOLEY & LARDNER LLP

(57) ABSTRACT

A semiconductor device includes a plurality of channel layers vertically separated from one another. The semiconductor device also includes an active gate structure comprising a lower portion and an upper portion. The lower portion wraps around each of the plurality of channel layers. The semiconductor device further includes a gate spacer extending along a sidewall of the upper portion of the active gate structure. The gate spacer has a bottom surface. Moreover, a dummy gate dielectric layer is disposed between the gate spacer and a topmost channel layer of plurality of channel layers. The dummy gate dielectric layer is in contact with a top surface of the topmost channel layer, the bottom surface of the gate spacer, and the sidewall of the gate structure.

20 Claims, 17 Drawing Sheets

(51) Int. Cl.
*H01L 29/423* (2006.01)
*H01L 29/786* (2006.01)
(52) U.S. Cl.
CPC ........... *H01L 21/823462* (2013.01); *H01L 29/42392* (2013.01); *H01L 29/6656* (2013.01); *H01L 29/66545* (2013.01); *H01L 29/66742* (2013.01); *H01L 29/66795* (2013.01); *H01L 29/78696* (2013.01)

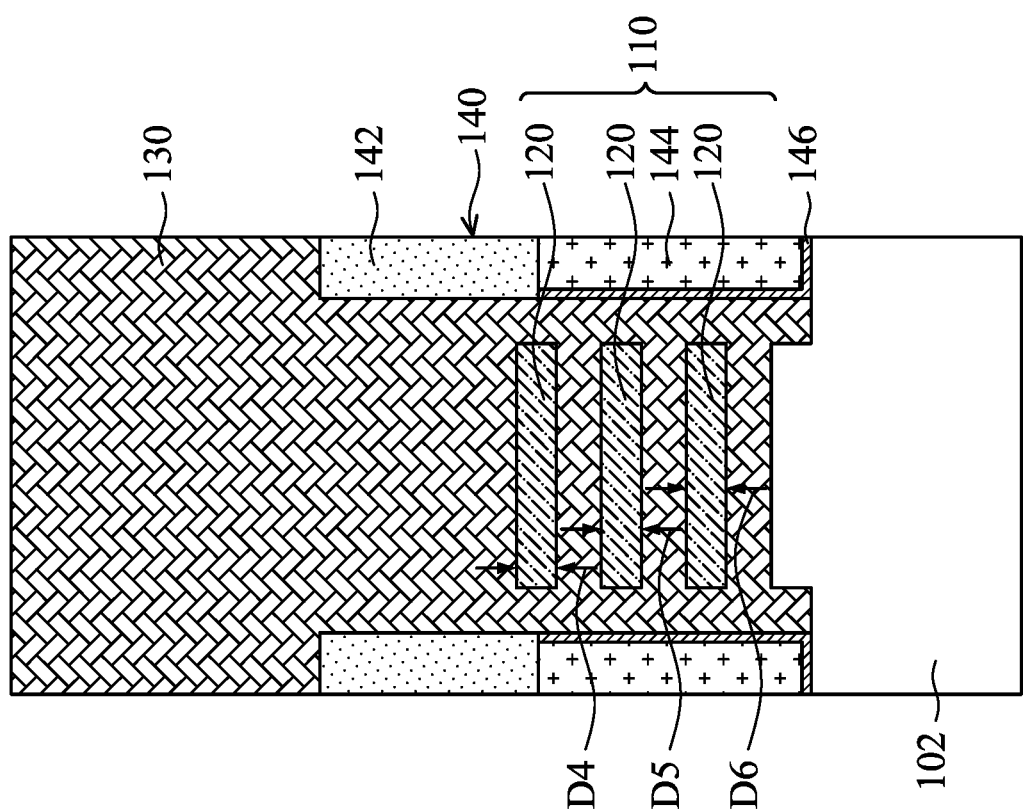
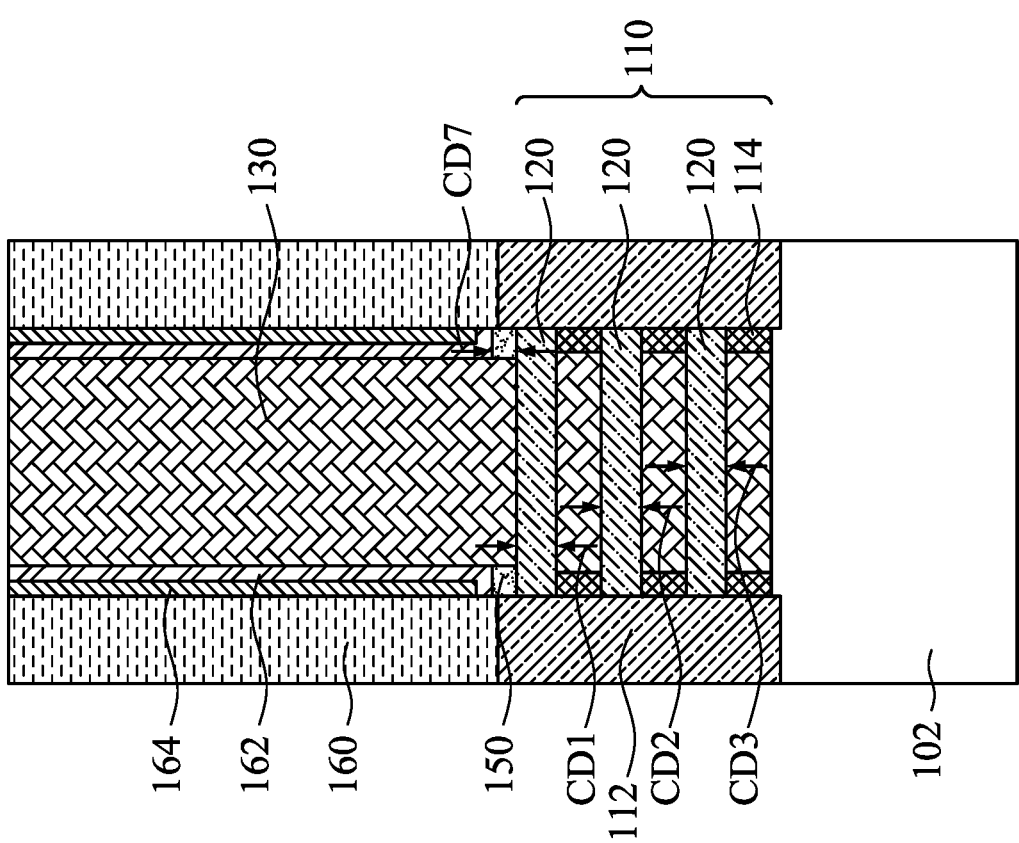

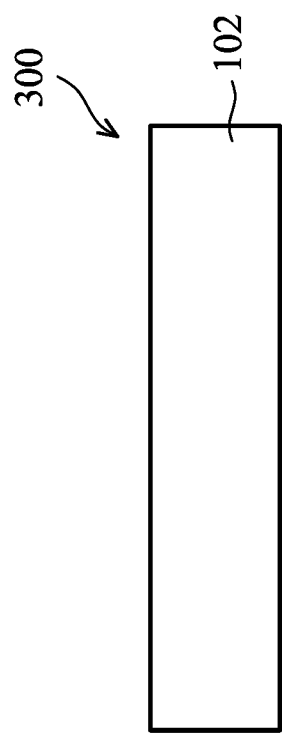
FIG. 3C
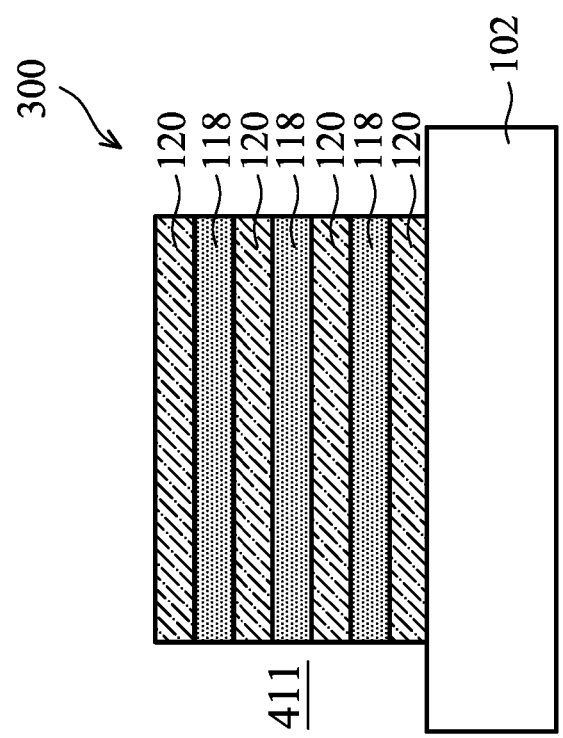
FIG. 3D2
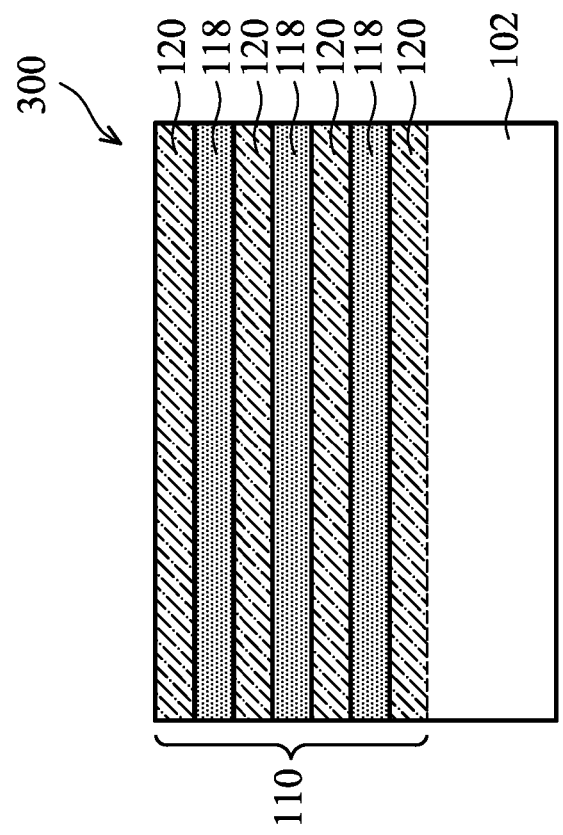
FIG. 3D1

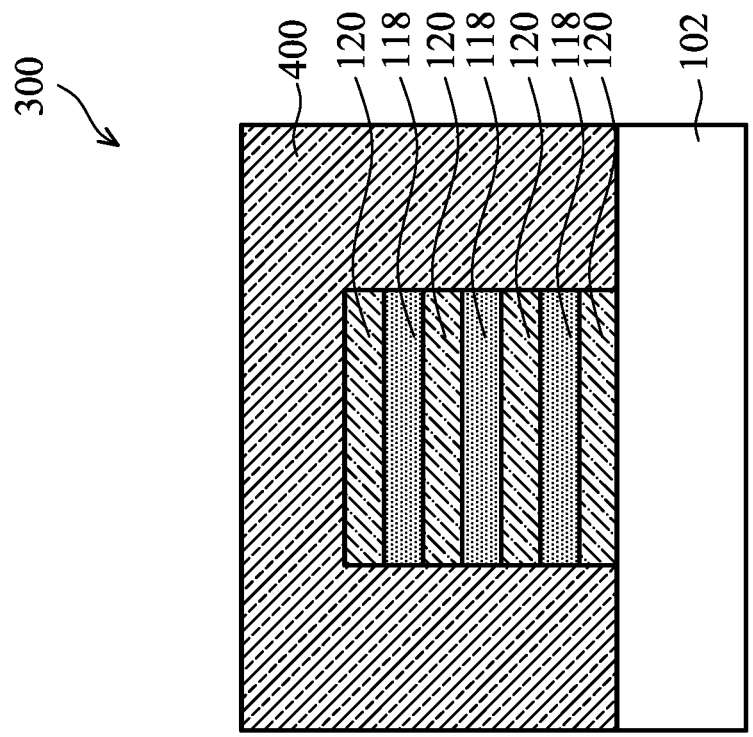
FIG. 3E2
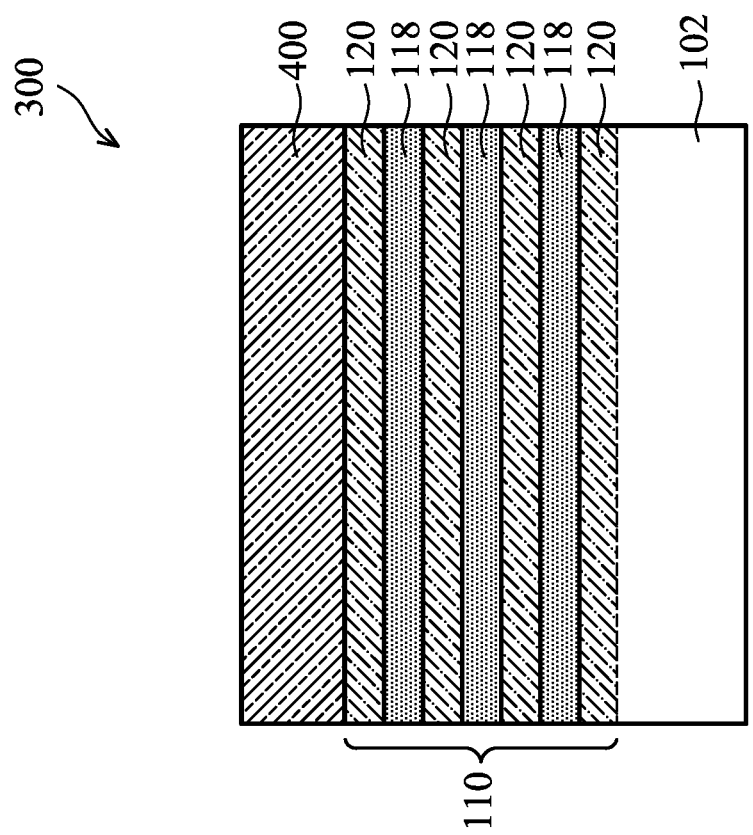
FIG. 3E1

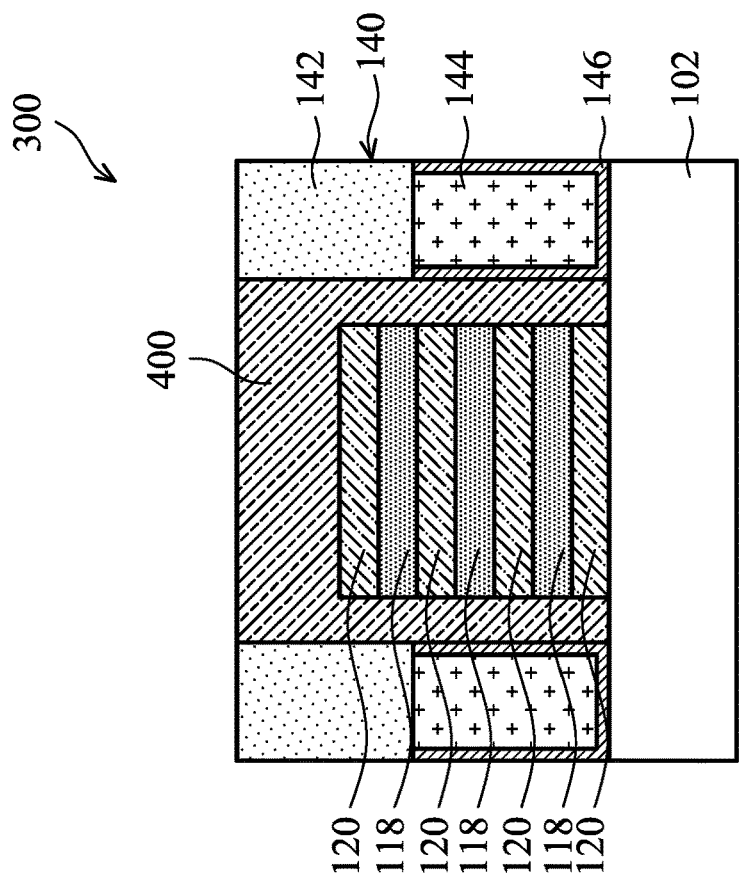
FIG. 3F2
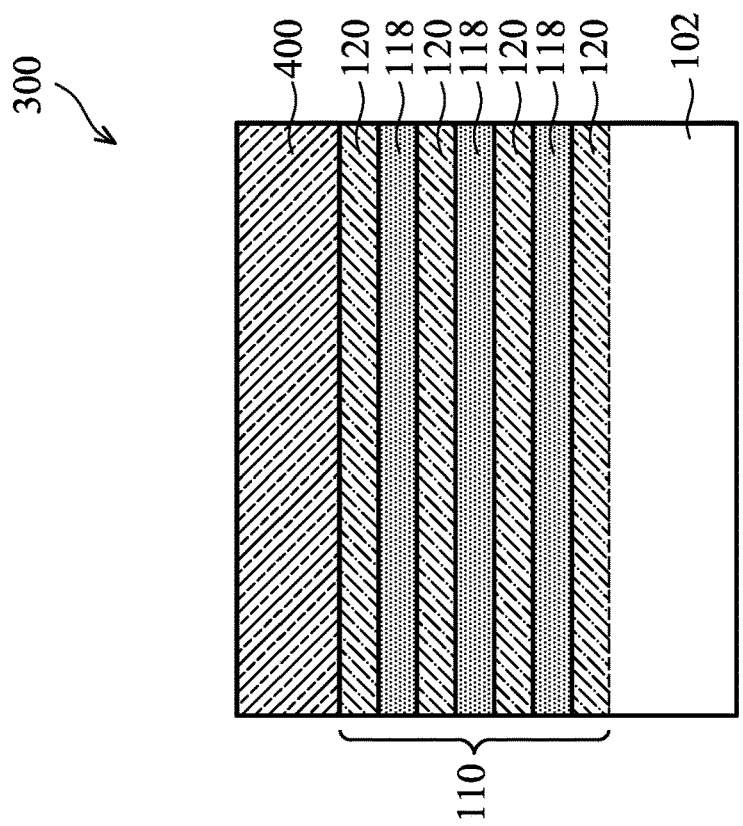
FIG. 3F1

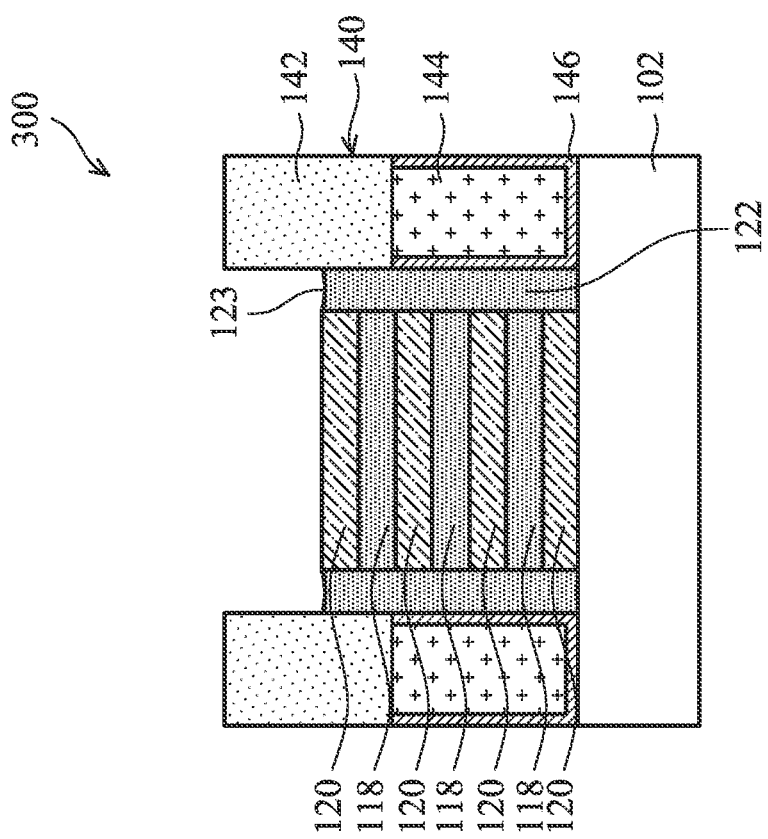
FIG. 3G2
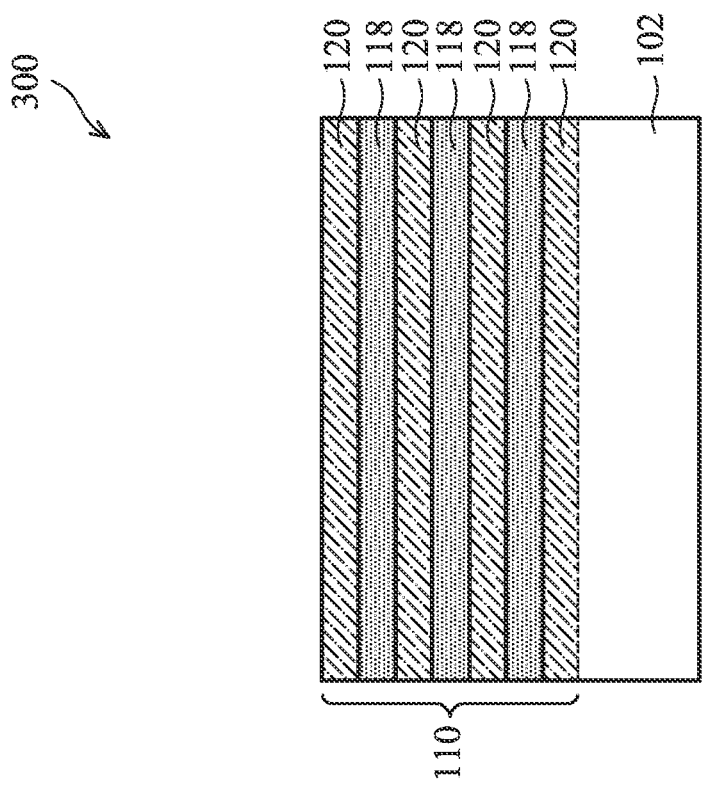
FIG. 3G1

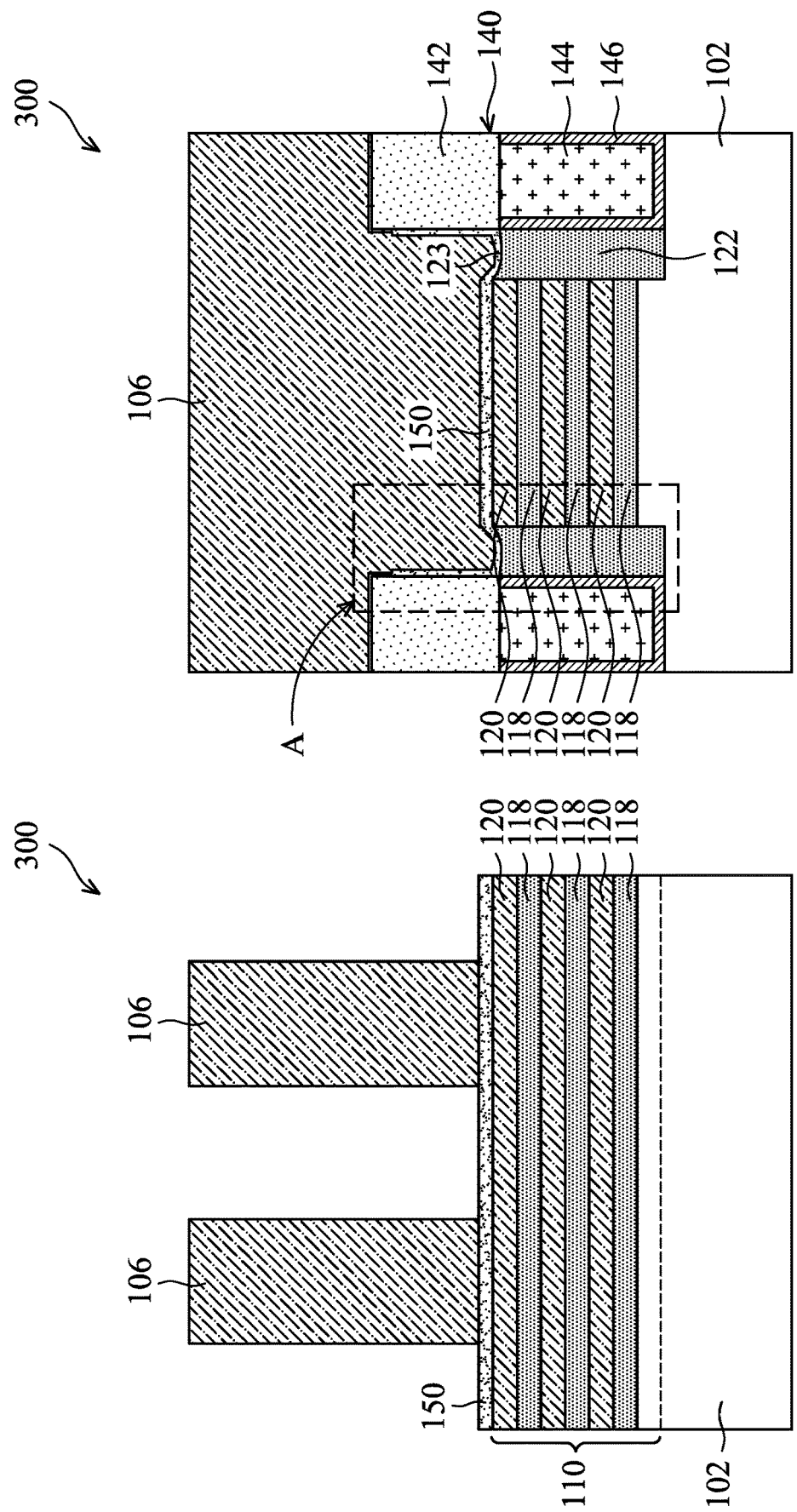

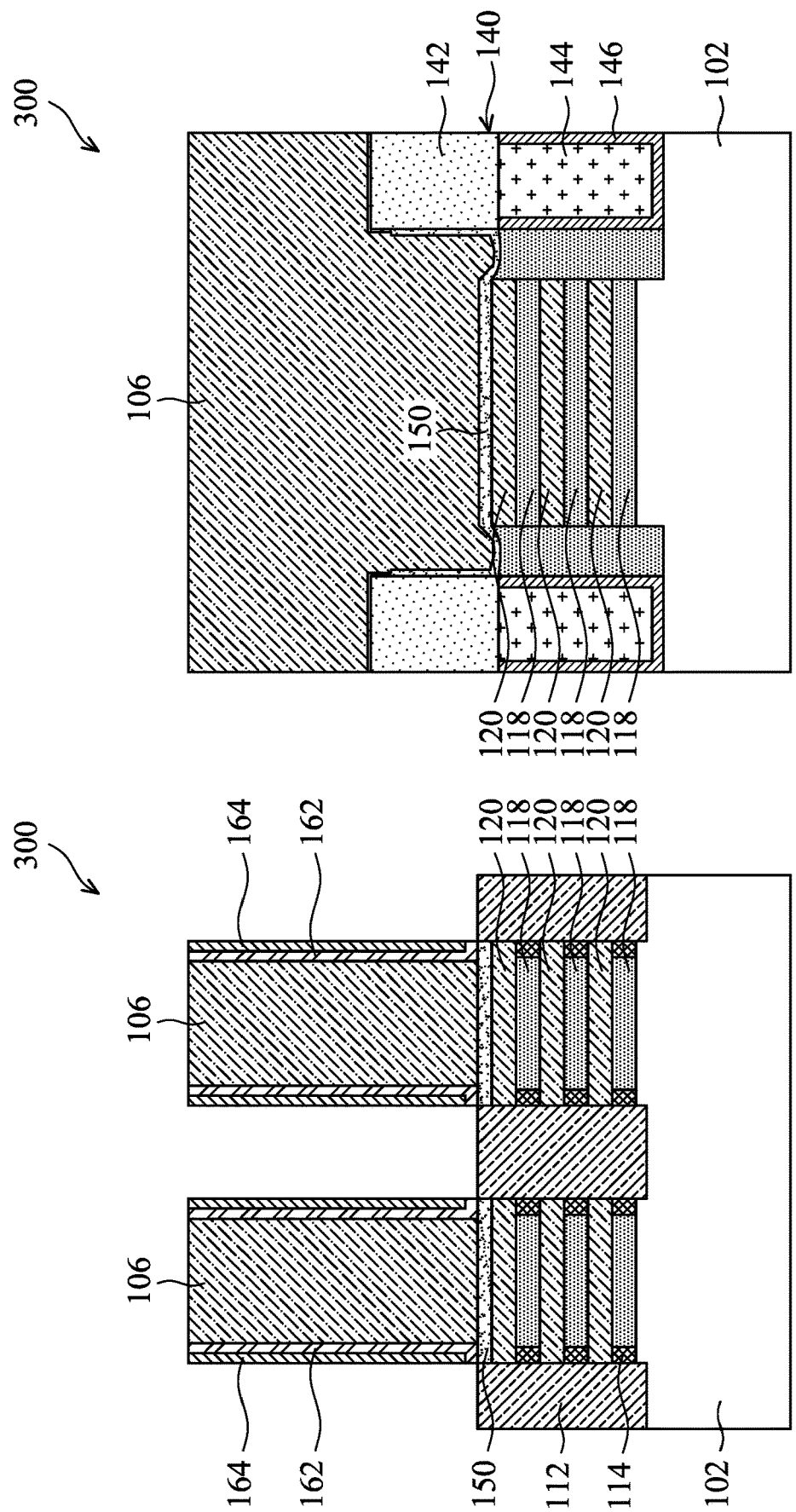

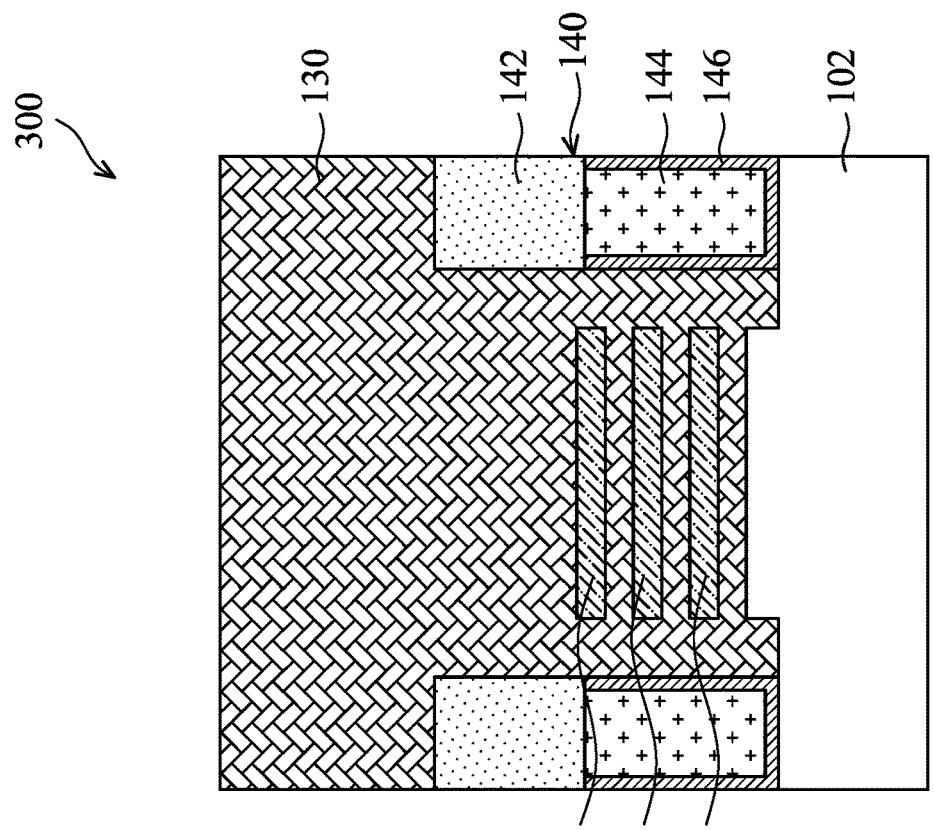
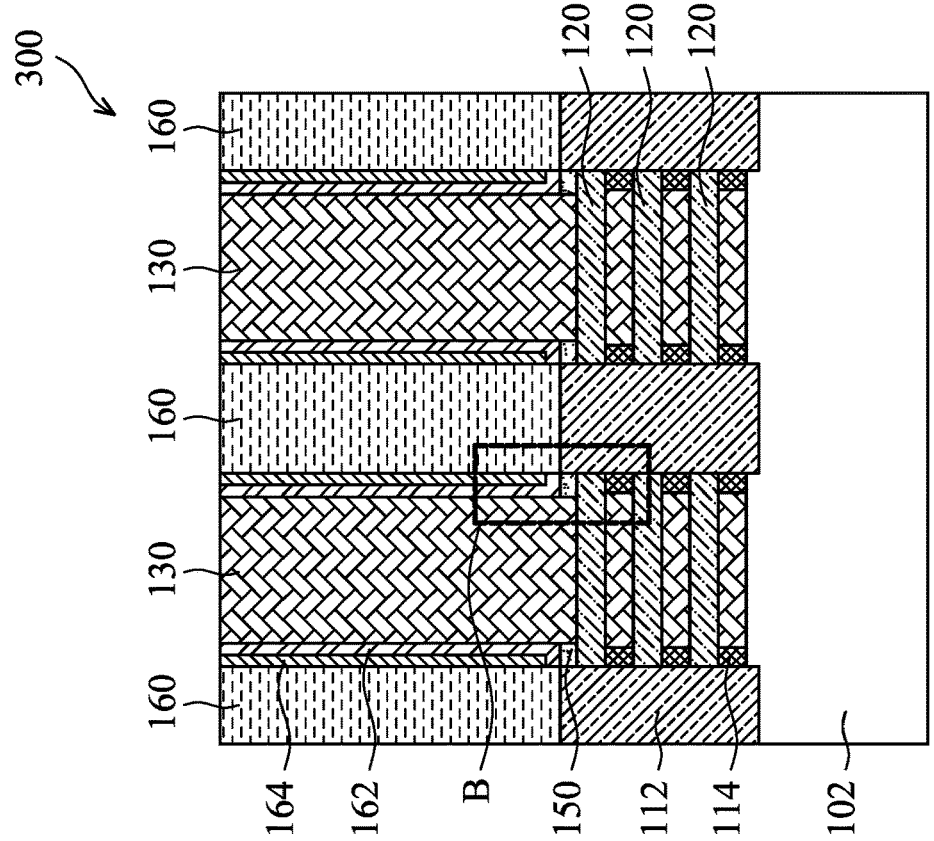
FIG. 9B
FIG. 9A

SEMICONDUCTOR DEVICES AND METHODS OF MANUFACTURING THEREOF

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a side cross-section view of the semiconductor device of FIG. 1 taken along the line Y-Y shown in FIG. 1, and FIG. 2B is a side cross-section view of the semiconductor device of FIG. 1 taken along the line X-X in FIG. 1.

FIGS. 3C-3G2, 4A, 4B, 5, 6A, 6B, 7A, 7B, 8A, 8B, 9A, 9B, 10, 11, and 12 illustrate various cross-sectional views of an example semiconductor device (or a portion of the example semiconductor device) during various fabrication stages, made by the method of FIGS. 3A-3B, in accordance with some embodiments.

DETAILED DESCRIPTION

Figure 1:
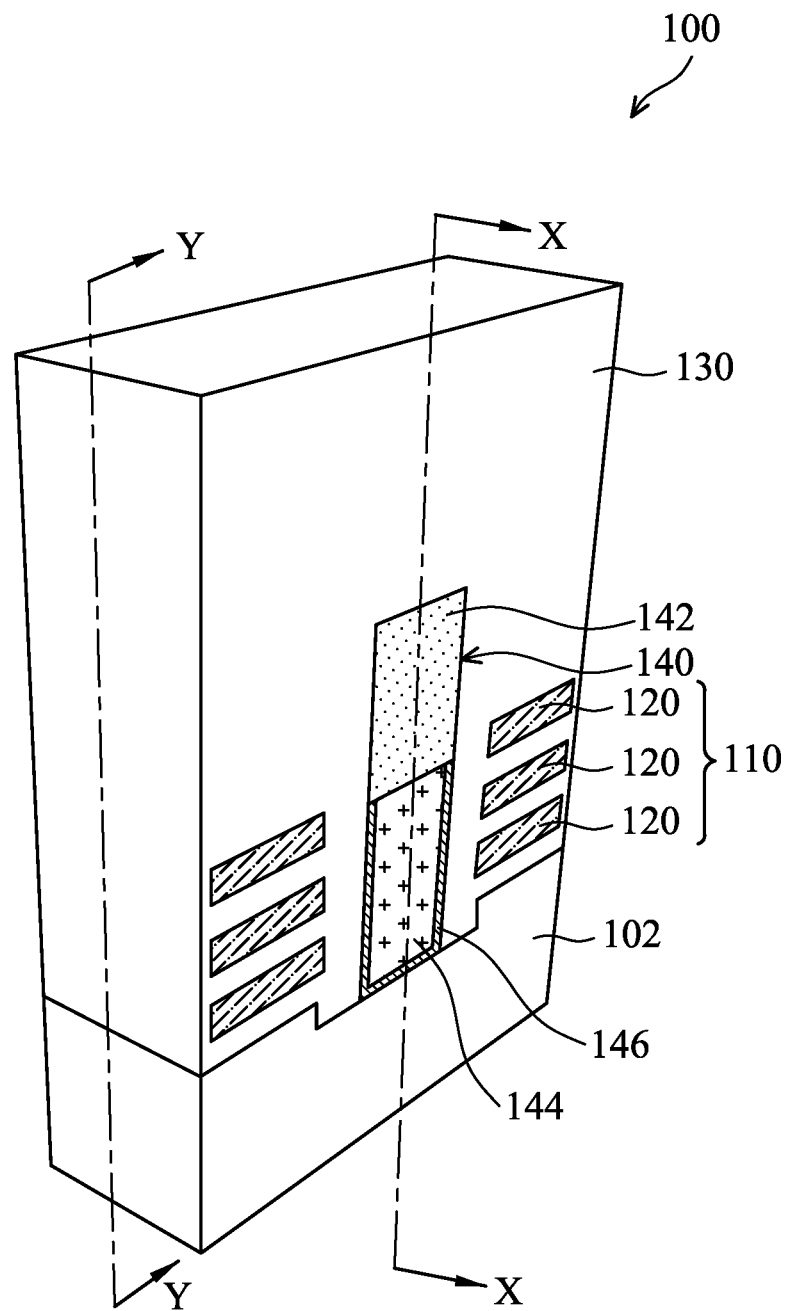
FIG. 1 illustrates a perspective view of a semiconductor device that includes a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a dummy gate structure is replaced with a replacement (e.g., metal or otherwise active) gate structure, and thus, the active gate structure may inherit the dimensions and profiles of the dummy gate structure (as formed). Such gate structures may be formed above and around a fin structure that includes a plurality of channel layers that are vertically separated from each other. The plurality of channel layers may be formed from a semiconductor material, for example, silicon (Si), silicon-germanium (SiGe), silicon-carbide (SiC) etc.). To replace the dummy gate structure with a replacement gate structure the dummy date structure is etched before disposing the active gate structure over the fin structure. Existing technologies use a dummy gate dielectric layer interposed between the dummy gate layer and the fin structure, and a thin buffer layer interposed between the topmost channel layer of the fin structure and a dummy gate dielectric layer. In some instances the buffer layer may also be formed from a semiconductor material (e.g., Si). In such existing technologies, the dummy gate dielectric layer and the buffer layer have to be broken through or otherwise etched so as to expose the topmost channel layer such that a later disposed active gate structure can electrically contact the topmost channel layer.

The existing technologies, however, face various issues during removal of the buffer layer. Since the buffer layer is generally also formed from a semiconductor material, and in some instances, may be formed from the same or similar material to the plurality of channel layers, the etching of the buffer layer may also inadvertently etch the topmost channel layer of the plurality of channel layers, which is undesirable. This may also disadvantageously impact deposition of the active gate structure, decrease metal gate process window, and cause lateral etching of source and drain structures disposed adjacent to the fin structure.

Embodiments of the present disclosure are discussed in the context of forming a semiconductor device, and particularly in the context of forming a replacement gate of a GAA FET device, but are equally applicable to complementary FET (CFET) devices, forksheet devices, or any other Fin FET structure. For example, the present disclosure provides semiconductor devices in which each of the plurality of channel layers has about the same thickness (i.e., a thickness between ±5% of each other). Moreover, a dummy gate dielectric layer is disposed between the gate spacer and a topmost channel layer of plurality of channel layers, and is in contact with a top surface of the topmost channel layer, the bottom surface of the gate spacer, and the sidewall of the gate structure. Various embodiments of methods described herein for forming the aforementioned semi-conductor devices skip deposition of the buffer layer such that a buffer layer etching operation, which can inadvertently also etch the topmost channel layer can, is also not used during manufacturing of the semiconductor device. Thus, the topmost channel layer is not damaged resulting in each of the plurality of channel layers having about the same thickness, thereby avoiding the issues identified in existing technologies. Moreover, methods described herein reduce manufacturing steps, thereby reducing fabrication complexity and cost.

FIG. 1 illustrates a perspective view of a semiconductor device 100 (e.g., a GAA FET device), and FIGS. 2A and 2B illustrate side cross-section views of the semiconductor device 100 taken along the lines Y-Y and X-X shown in FIG. 1, respectively. As indicated, cross-section Y-Y extends along a longitudinal axis of the plurality of channel layers 120 and in a direction of a current flow between the source/drain structures 112 (e.g., in the Y direction). The active gate structure 130 extends along the Y-Y cross-section. On the other hand, the cross-section X-X extends along an axis that is perpendicular to the longitudinal axis and along a direction in which a fin structure 110 and a dummy fin structure 140 extends.

The semiconductor device 100 includes a substrate 102 and the fin structure 110 disposed above the substrate 102. The fin structure 110 includes a plurality of channel layers 120 vertically separated from one another. Each of channel layers 120 may include nanostructures (e.g., nanosheets, nanowires, etc.) and may be formed from a semiconductor material, for example, Si, Ge, SiGe, silicon carbide (SiC), etc. For example, as shown in FIGS. 2A and 2B, the device 100 includes 3 channel layers 120 having a thickness from the topmost to the bottom most channel layer 120 in a direction perpendicular to a direction in which the fin structure 110 extends (FIG. 2A) of CD1, CD2, and CD3, respectively, and thicknesses from the topmost to the bottom most channel layer 120 in along a direction which the fin structure 110 extends (FIG. 2B) of CD4, CD5, and CD6, respectively. Each of the thicknesses CD1, CD2, CD3, CD4, CD5, and CD6, may be about the same, for example, in a range of 6 nm to 20 nm, inclusive.

The semiconductor device 100 includes an active gate structure 130 that includes a lower portion and an upper portion. The active gate structure 130 is formed from a conductive material such as a metal, for example, tungsten (W), copper (Cu), cobalt (Co). etc., or a high-k dielectric material, for example, hafnium oxide (HfO), tantalum nitride (TaN), etc. The lower portion of the active gate structure 130 wraps around each of the plurality of channel layers 120, (e.g., a full perimeter of each of the channel layers 120). As shown in FIG. 2A, source/drain structures 112 are disposed on opposing sides of the fin structure 110, and thereby opposing sides of the active gate structure 130 in a first direction, and in contact with first axial edges of the each of the plurality of channel layers 120. The source/drain structures 112 may include a conducting material (e.g., a n or p-doped semiconductor such as Si, SiGe, etc.) may be formed using an epitaxial growth process.

An inner spacer 114 is interposed between each adjacent channel layer 120 in an axial direction of the device 100. The inner spacer 114 disposed on opposing sides of the lower portion of the active gate structure 130 such that the inner spacer 114 is interposed in the radial direction between the lower portion of the active gate structure 130 and the source/drain structure 112. The inner spacer 114 is formed from an insulative material, for example, silicon nitride (SiN), silicon oxide (SiO), silicon carbide nitride (SiCN), silicon oxycarbonitride (SiOCN), silicon oxynitride (SiON), etc., and serves to isolate the active gate structure 130 from the source/drain structures 112.

An interlayer dielectric (ILD) 160 is disposed over the source/drain structure 112 on either side of the active gate structure 130 in the first direction. A gate spacer 162 extends along a sidewall of the upper portion of the active gate structure 130 such that gate spacer 162 is interposed between the ILD 160 and the outer surface of the sidewall of the upper portion of the active gate structure 130 in the first direction. The gate spacer 162 is formed from an insulative material (e.g., SiN, SiO, SiCN, SiOCN, SiON, etc.). In some embodiments, an intermediate gate spacer 164 may be interposed between the ILD 160 and the gate spacer 162. The intermediate gate spacer 164 may be formed from the same or different material from the gate spacer 162.

The gate spacer 162 may have a length that is smaller than a length of the ILD 160 such that the gate spacer 162 has a bottom surface which is vertically separated from the topmost channel layer 120. A dummy gate dielectric layer 150 is disposed between the gate spacer 162 and the topmost channel layer 120 of plurality of channel layers 120. The dummy gate dielectric layer 150 may be formed from SiO, SiN or any other suitable material. The dummy gate dielectric layer 150 is in contact with a top surface of the topmost channel layer 120, the bottom surface of the gate spacer 162, and the sidewall of the active gate structure 130. In some embodiments, the dummy gate dielectric layer 150 may also contact a radially inner surface of the ILD 160 and/or the source drain structure 112. In some embodiments, the dummy gate dielectric layer 150 has a thickness CD7 in a range of 1 nm to 10 nm, inclusive.

The GAA FET device 100 also includes dummy fin structure 140 interposed between a first set and a second set of the plurality channel layers 120, as shown in FIG. 1 along a second direction that is perpendicular to the first direction. The lower portion of the active gate structure 130 is also wrapped around the dummy fin structure 140. The dummy fin structure 140 may include a lower portion 144 and an upper portion 142. The lower portion 144 may be formed from SiO (e.g., CVD SiO) or any other insulating material. A dummy fin spacer 146 is dispose around sidewalls and a bottom surface of the lower portion 144, and may be formed from SiN, etc. The upper portion 142 may serve as a cladding layer that overlays and protects the lower portion 144. The upper portion 142 may be formed from a high-k dielectric material, for example, HfO, TaN, aluminum oxide ($Al_2O_3$), SiN, SiCN, SiOCN, etc.

Figure 10:
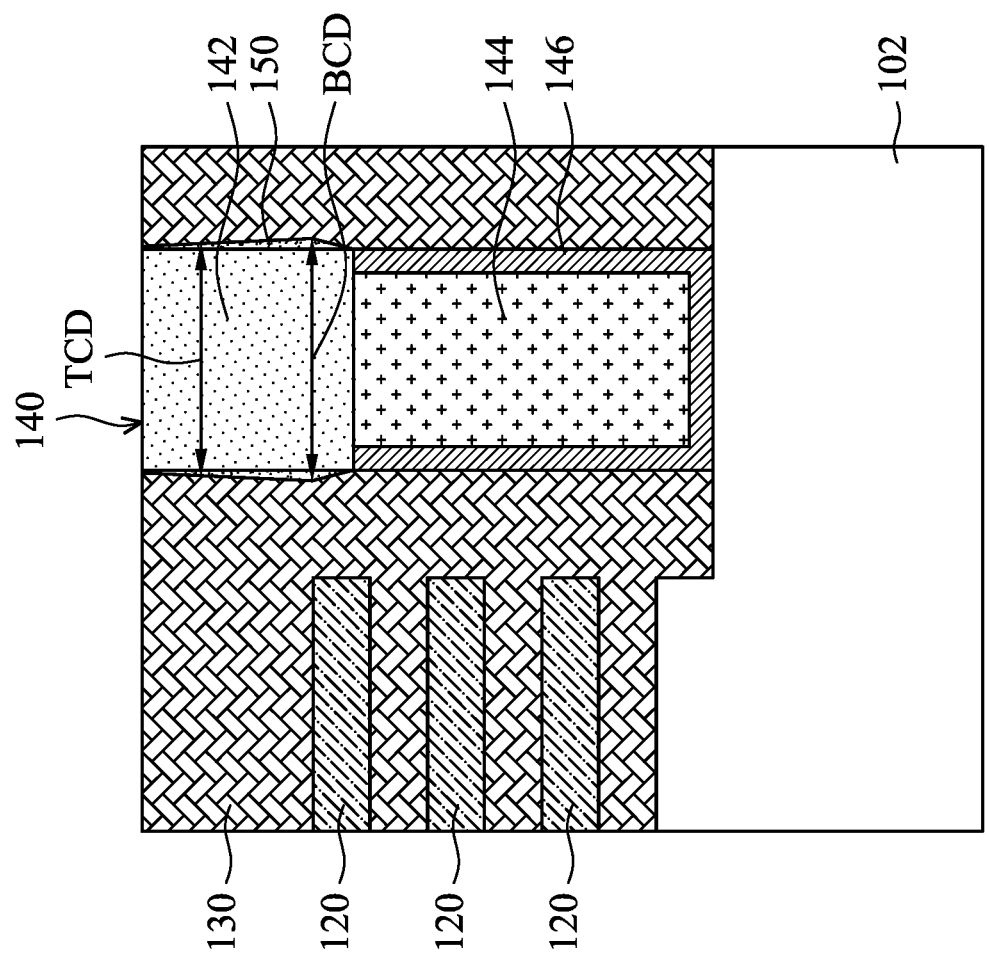

The dummy gate dielectric layer 150 may also be disposed on a sidewall of at least a portion of the upper portion 142 of the dummy fin structure 140. For example, FIG. 10 shows a side cross-section view of a portion of the device 100 along the Y direction, showing the dummy gate dielectric layer 150 being disposed on the upper portion 142 of the dummy fin structure 140 along sidewalls of the upper portion 142 that extends along the same direction that the dummy fin structure 140 extends. The dummy gate dielectric layer 150 has a larger thickness at a location proximate to a bottom surface of the upper portion 142 of the dummy fin structure 140 than at a location proximate to a top surface of the upper portion 142 of the dummy fin structure 140. Therefore, a first thickness for width) BCD of the upper portion 142 including the dummy gate dielectric layer 150 at the location proximate to the bottom surface of the upper portion 142 is larger than a second thickness (or width) TCD of the upper portion 142 including the dummy gate dielectric layer 150 at the location proximate to the top surface of the upper portion 142, such that that upper portion 142 tapers inwards from its bottom surface to its top surface.

Figure 3A:
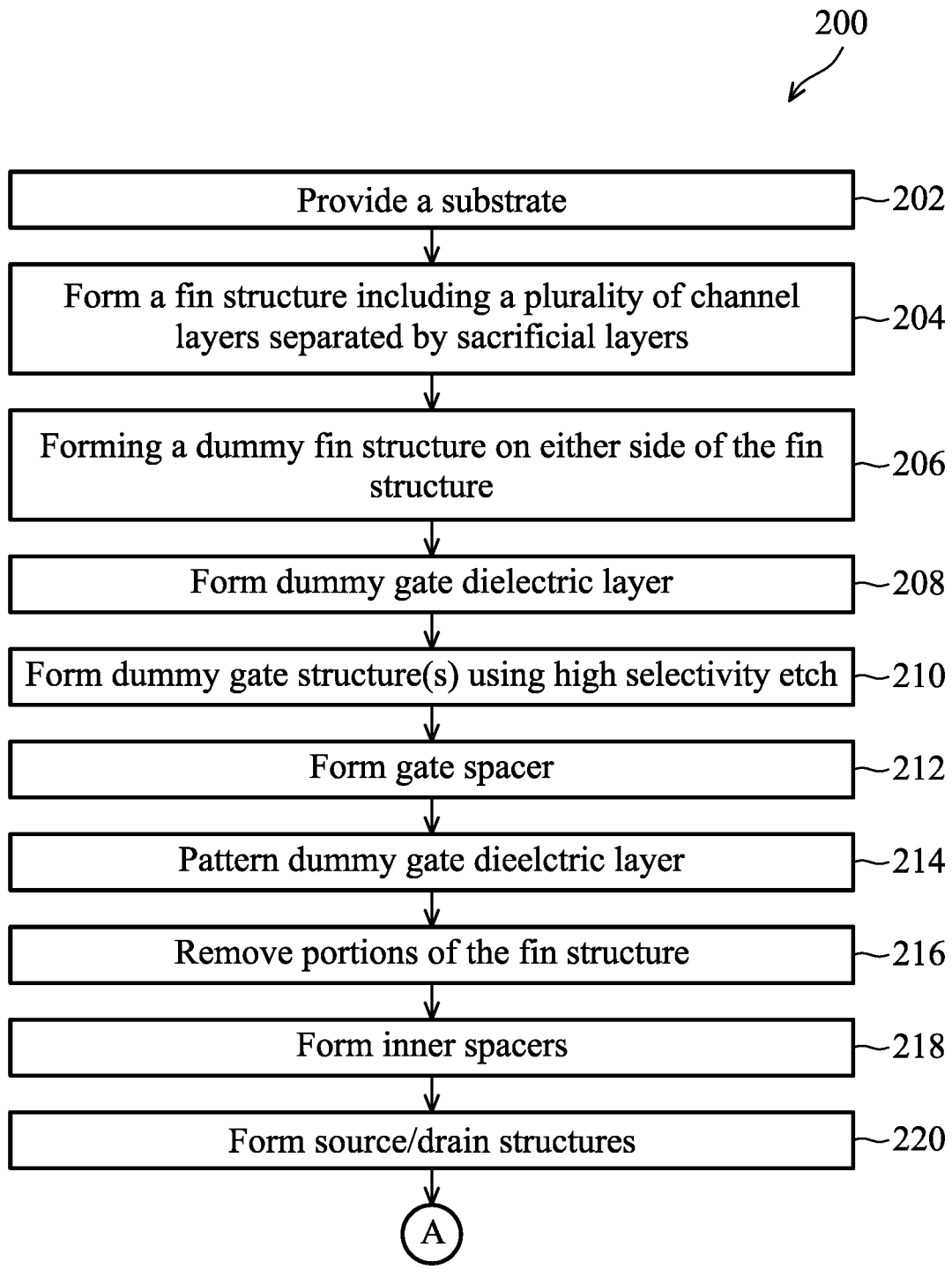
FIGS. 3A-3B illustrate a schematic flowchart of a method for manufacturing a semiconductor device, according to some embodiments.
Figure 3B:
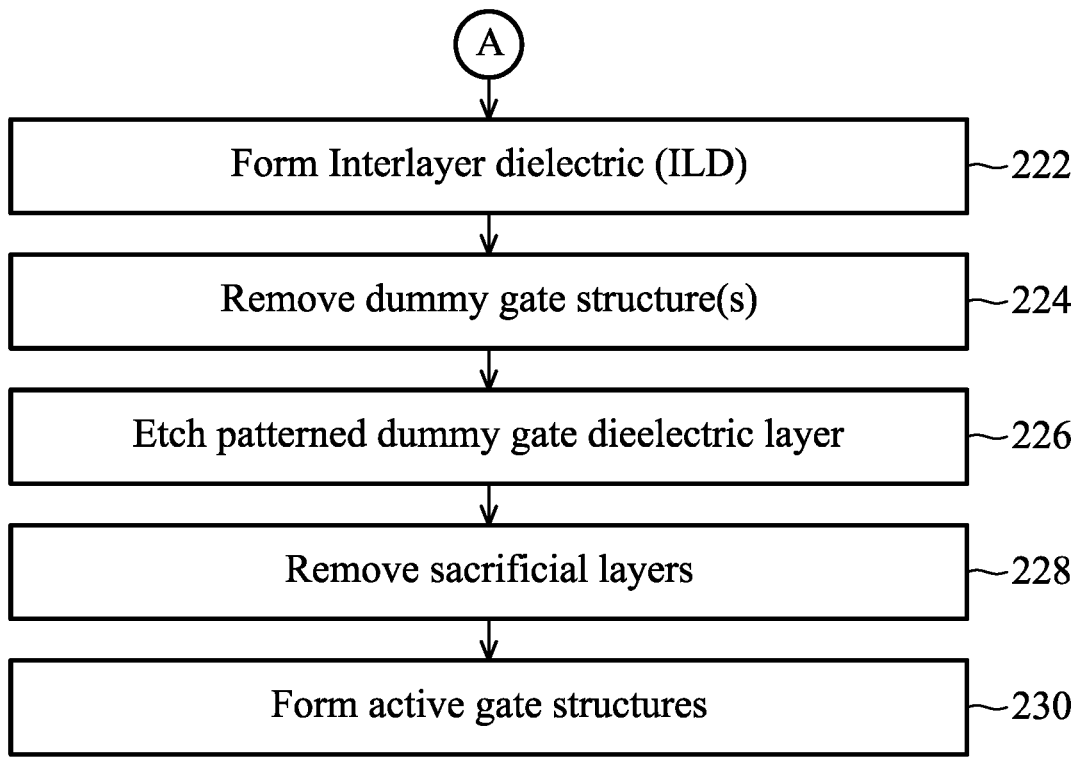

FIGS. 3A-3B illustrate a flowchart of a method 200 to form a semiconductor device 300, for example, a non-planar transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a gate-all-around (GAA)

transistor device, or the like. It should be noted that the method 200 is merely an example, and is not intended to limit the present disclosure. Accordingly, it is understood that additional operations may be provided before, during, and after the method 200 of FIG. 2 FIGS. 3A-3B, and that some other operations may only be briefly described herein. In some embodiments, operations of the method 200 may be associated with cross-sectional views of an example GAA FET device at various fabrication stages as shown in FIGS. 3C-3G2, 4A, 4B, 5, 6A, 6B, 7A, 7B, 8A, 8B, 9A, 9B, 10, 11, and 12 respectively, which will be discussed in further detail below. While various operations of the method 200 and associated illustrations shown in FIGS. 3C-3G2, 4A, 4B, 5, 6A, 6B, 7A, 7B, 8A, 8B, 9A, 9B, 10, 11, and 12 are described with respect to the semiconductor device 300 that represents a GAA FET device, the operations are equally applicable to any other semiconductor device (e.g., a FinFET device, a nanosheet transistor device, a nanowire transistor device, a vertical transistor device, etc.). Although FIGS. 3C-12 illustrate the semiconductor device 300, it is understood the semiconductor device 300 may include a number of other devices such as inductors, fuses, capacitors, coils, etc., which are not shown in FIGS. 3C-12, for purposes of clarity of illustration.

In brief overview, the method 200 starts with operation 202 of providing the substrate (e.g., the substrate 102). For example, FIG. 3C is a cross-sectional view of the semiconductor device 300 cut along a direction along which the fin structure 110 extends (e.g., cross-section X-X in FIG. 1) showing the substrate 102. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

At operation 204, one or more fin structure (e.g., the fin structure 110) are formed. The fin structure extends along a first direction and includes a plurality of sacrificial layers (e.g., sacrificial layers 118) and a plurality of channel layers (e.g., the channel layers 120) alternately stacked on top of one another, i.e., the channel layers are separated by sacrificial layers. For example, FIG. 3D1 is a cross-sectional view of the semiconductor device 300 cut along a direction along which the fin structure 110 extends (e.g., cross-section X-X in FIG. 1), and FIG. 3D2 is a cross-sectional view of the semiconductor device 300 cut along a direction along which the dummy gate structure 106 or active gate structure 130 of the semiconductor device 300 extend (e.g., cross-section Y-Y in FIG. 1). As shown in FIGS. 3D1-3D2, the fin structure 110 includes the plurality of channel layers 120 and the plurality of sacrificial layers 118 interposed between the plurality of channel layers 120.

The channel layers 120 and the sacrificial layers 118 are alternately disposed on top of one another in a vertical direction to form a stack representing a fin structure 110. For example, one of the sacrificial layers 118 is disposed over one of the channel layers 120, then another one of the channel layers 120 is disposed over the sacrificial layer 118, so on and so forth. While FIGS. 3D1-3D2 show the semiconductor device 300 as including 3 channel layers 120 and three sacrificial layers 118 alternately disposed on one another, in other embodiments, the semiconductor device 300 or any other semiconductor device described herein can include any number of channel layers or sacrificial layers (e.g., 2, 4, 5, 6, 7, 8, or even more). One of the channel layers 120 that is located most distal from the substrate 102 represents a topmost channel layer 120.

Each of the plurality of channel layers 120 have about the same thickness, for example, in a range of about 6 nm to about 20 nm, inclusive. Moreover, the sacrificial layers 118 may have the same thickness or different thickness from the channel layers 120. The thickness of the sacrificial layers 118 may range from a few nanometers to few tens of nanometers (e.g., in a range of 5 nm to 20 nm, inclusive).

The channel layers 120 and the sacrificial layers 118 have different compositions. In various embodiments, the channel layers 120 and the sacrificial layers 118 have compositions that provide for different oxidation rates and/or different etch selectivity between the respective layers. In an embodiment, the channel layers 120 include silicon germanium ($Si_{1-x}Ge_x$), and the sacrificial layers 118 include silicon (Si). In an embodiment, each of the sacrificial layers 118 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the sacrificial layers 118 (e.g., of silicon). In still other embodiments, the sacrificial layers 118 may be formed from an insulative material, for example, SiO, SiN, etc. The sacrificial layers 118 are merely spacer layers that are eventually removed and do not form an active component of the semiconductor device 300.

In various embodiments, the channel layers 120 may be intentionally doped. For example, when the semiconductor device 300 (e.g., the GAA FET device 100) is configured in n-type (and operates in an enhancement mode), each of the channel layers 120 may be silicon that is doped with a p-type dopant such as boron (B), aluminum (Al), indium (In), and gallium (Ga); and when the semiconductor device 300 is configured in p-type (and operates in an enhancement mode), each of the channel layers 120 may be silicon that is doped with an n-type dopant such as phosphorus (P), arsenic (As), antimony (Sb). In another example, when the semiconductor device 300 is configured in n-type (and operates in a depletion mode), each of the channel layers 120 may be silicon that is doped with an n-type dopant instead; and when the semiconductor device 300 is configured in p-type (and operates in a depletion mode), each of the channel layers 120 may be silicon that is doped with a p-type dopant instead. In some embodiments, each of the channel layers 120 is $Si_{1-x}Ge_x$ that includes less than 50% (x<0.5) Ge in molar ratio. For example, Ge may comprise about 15% to 35% of the channel layers 120 of $Si_{1-x}Ge_x$ in molar ratio.

Either of the channel layers 120 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the channel layers 120 may be chosen based on providing differing oxidation rates and/or etch selectivity.

In various embodiments, the channel layers 120 and/or the sacrificial layers 118 may be epitaxially grown from the substrate 102. For example, each of the channel layers 120 and the sacrificial layers 118 may be grown by a molecular beam epitaxy (MBE) process, a chemical vapor deposition (CVD) process such as a metal organic CVD (MOCVD) process, a furnace CVD process, and/or other suitable epitaxial growth processes. During the epitaxial growth, the crystal structure of the substrate 102 extends upwardly, resulting in the channel layers 120 and the sacrificial layers 118 having the same crystal orientation as the substrate 102. In other embodiments, the channel layers 120 and the sacrificial layers 118 may be grown using an atomic layer deposition (ALD) process.

Upon growing the channel layers 120 and the sacrificial layers 118 on the substrate 102 (as a stack), the stack may be patterned to form one or more fin structures 110 (FIG. 3D2). Each of the fin structures 110 is elongated along the first direction, for example, a first lateral direction (e.g., the Y direction), and includes a stack of the patterned channel layers 120 and the sacrificial layers 118 interleaved with each other. The fin structure 110 is formed by patterning the channel and sacrificial layers 120 and 118, and the substrate 102 using, for example, photolithography and etching techniques. For example, a mask layer (which can include multiple layers such as, for example, a pad oxide layer and an overlying pad nitride layer) is formed over the topmost channel layer 120. The pad oxide layer may be a thin film comprising silicon oxide formed, for example, using a thermal oxidation process. The pad oxide layer may act as an adhesion layer between the topmost channel layer 120 and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example, or any other suitable deposition process.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the channel layers 120, the sacrificial layers 118, and the substrate 102 to form trenches (or openings) extending in the first direction, thereby defining the fin structures 110 between adjacent trenches, as shown in FIG. 3D2. When multiple fin structures 110 are formed, such a trench may be disposed between any adjacent ones of the fin structures 110. In some embodiments, the fin structure 110 is formed by etching trenches 411 in the channel layers 120, the sacrificial layers 118, and substrate 102 using, for example, reactive ion etch (RIE), neutral beam etch (NBE), deep reactive ion etch (DRIE), and the like, or combinations thereof. The etch may be anisotropic. In some embodiments, the trenches 411 may be strips (when viewed from the top) parallel to each other, and closely spaced with respect to each other. In some embodiments, the trenches 411 may be continuous and surround the fin structure 110. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial structure is formed over the substrate 102 and patterned using a photolithography process. Spacers are formed alongside the patterned sacrificial structure using a self-aligned process. The sacrificial structure is then removed, and the remaining spacers, or mandrels, may then be used to pattern the fin structure 110.

At operation 206, one or more dummy fin structures (e.g., the dummy fin structure 140) are formed. The dummy fin structures extend along the first direction parallel to the fin structure and have a lower portion and an upper portion. For example, shown in, FIGS. 4A-4B, the semiconductor device 300 includes the dummy fin structure 140 including the upper portion 142 and the lower portion 144 that has the dummy fin spacer 146 disposed around sidewalls and a bottom surface of the lower portion 144. The lower portion 144 may be formed from an insulative material, for example, SiO, SiN, etc. The dummy fin spacer 146 may be formed from the same or different material from the lower portion 144. The upper portion 142 may serve as a cladding layer that overlays and protects the lower portion 144. The upper portion 142 may be formed from a high-k dielectric material, for example, HfO, TaN, $Al_2O_3$, SiN, SiCN, SiOCN, etc.

Corresponding to operation 206, FIGS. 3E1-3G2 show the semiconductor device 300 at various stages of fabrication for forming the dummy fin structures 140. For example, FIG. 3E1 is a cross-sectional view of the semiconductor device 300 cut along a direction along which the fin structure 110 extends (e.g., cross-section X-X in FIG. 1), and FIG. 3E2 is a cross-sectional view of the semiconductor device 300 cut along a direction along which the dummy gate structure 106 of the semiconductor device 300 extends (e.g., cross-section Y-Y in FIG. 1) with an isolation layer 400.

The isolation layer 400, which is formed of an insulation material and can electrically isolate neighboring fin structures 110 from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. In some embodiments, the isolation layer 400 may be formed from the same material as the sacrificial layers 118. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation layer 400.

In some embodiments, the isolation layer 400 includes a liner, e.g., a liner oxide (not shown), at the interface between the isolation layer 400 and the substrate 102. In some embodiments, the liner oxide is formed to reduce crystalline defects at the interface between the substrate 102 and the isolation layer 400. Similarly, the liner oxide may also be used to reduce crystalline defects at the interface between the fin structures 110 and the isolation layer 400. The liner oxide (e.g., silicon oxide) may be a thermal oxide formed through a thermal oxidation of a surface layer of the substrate 102, although other suitable method may also be used to form the liner oxide.

FIG. 3F1 is a cross-sectional view of the semiconductor device 300 cut along a direction along which the fin structure 110 extends (e.g., cross-section X-X in FIG. 1), and FIG. 3F2 is a cross-sectional view of the semiconductor device 300 cut along a direction along which the dummy gate structure 106 of the semiconductor device 300 extends (e.g., cross-section Y-Y in FIG. 1) after formation of the dummy fins structures 140 adjacent to a fin structure 110.

To form the dummy fin structure 140, a patterned mask may be formed over the isolation layer 400 to expose portions of the isolation layer 400 to form the dummy fins 140 (e.g., in the trenches 411). Subsequently, the exposed portions of the isolation layer 400 may be etched using, for example, reactive ion etch (RIE), neutral beam etch (NBE), the like, or combinations thereof, thereby defining cavities. The cavities are then filled with the dielectric material of the dummy fin structures 140 (as described above), followed by a CMP process to form the dummy fins 140. the dummy fin spacer 146 may be formed on sidewalls of the cavities defined in the isolation layer 400, and on, in some embodiments a top surface the substrate 102 that forms a bottom surface of the cavities formed in the isolation layer. For example, the dummy fin spacer 146 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating is deposited such that the dummy fin spacer 146 is continuous between the sidewalls of the fin structure 110, and a top surface of the substrate 102 located between the sidewalls of the adjacent fin structures 110.

Subsequently, the lower portion 144 of the dummy fin structure 140 is formed (e.g., using physical vapor deposition (PVD), chemical vapor deposition (CVD), low pressure chemical vapor deposition (LPCVD), plasma enhanced CVD (PECVD), ALD, MBE, any other suitable process or a combination thereof) in the cavities formed in the isolation layer 400, such that the adjacent fin structures 110 are separated from the lower portion 144 via the dummy fin spacer 146 and a portion of the isolation layer 400 disposed between the lower portion 144 and the fin structure 110. The lower portion 144 of the dummy fin structure extends in the first direction.

The upper portion 142 of the dummy fin structure 140 may subsequently be formed over the lower portion 144 in the cavities (e.g., using PVD, CVD, LPCVD, PECVD, ALD, MBE, any other suitable process or a combination thereof). The upper portion 142 also extends in the first direction. The upper portion 142 may serve as a cladding layer that overlays and protects the lower portion 144. The upper portion 142 may be formed from a high-k dielectric material, for example, HfO, TaN, $Al_2O_3$, SiN, SiCN, SiOCN, etc.

In advanced processing nodes, such dummy fin structures can be disposed next to one or more active fin structures (e.g., between two adjacent active fin structures) to improve the overall design and fabrication of a semiconductor device. For example, the dummy fin structures can be used for optical proximity correction (OPC) to enhance a pattern density and pattern uniformity in the stage of designing the semiconductor device. In another example, adding dummy fin structures adjacent to active fins can improve chemical-mechanical polishing (CMP) performance when fabricating the semiconductor device. The dummy fin structures (e.g., the dummy fin structures 140) is designed to stay inactive or electrically non-functional, when the semiconductor device is appropriately configured and powered.

In some embodiments, the dummy fin structures 140 may be formed concurrently with or subsequently to the formation of the isolation layer 400. As an example, after cutting the fin structures 110 (FIG. 3D2), the insulation material of the isolation layer 400 may be deposited over the fin structures 110 in a controlled deposition rate, thereby causing cavities to be spontaneously formed in the trenches 411. The cavities are then filled with one or more dielectric material of the dummy fin structures 140 (using low-pressure chemical vapor deposition (LPCVD) or plasma enhanced chemical vapor deposition (PECVD), for example), followed by a CMP process to form the dummy fin structures 140. In accordance with various embodiments, the dummy fin structures 140 are formed to have a height that is, greater than a height of the fin structures 110, both of which are measured from the top surface of substrate 102. Alternatively stated, the dummy fin structures 140 may outwardly extend from the substrate 102 farther than the fin structures 110. As a non-limiting example the height of the dummy fin structures 140 may range between about 10 nm and about 200 nm, and the height of the fin structures 110 may range between about 5 nm and about 150 nm. Further, the dummy fin structures 140 can have a width, which can range between about 2 nm and 500 nm, for example.

Once the dummy fin structures 140 are formed, a portion of the isolation layer 400 disposed on top of the fin structures 110, and on the top surface and walls of the dummy fin structure 140 are etched, such that a portion of the isolation layer remains disposed between the fin structure 110 and adjacent dummy fin structures 140 to form isolation structures. For example, FIG. 3G1 is a cross-sectional view of the semiconductor device 300 cut along a direction along which the fin structure 110 extends (e.g., cross-section X-X in FIG. 1), and FIG. 3G2 is a cross-sectional view of the semiconductor device 300 cut along a direction along which the dummy gate structure 106 of the semiconductor device 300 extends (e.g., cross-section Y-Y in FIG. 1) after formation of the dummy fins structures 140 adjacent to a fin structure 110 with an isolation structure 122 disposed therebetween. The isolation structures 122 may be formed by a controlled etch of the isolation layer 400 until the isolation layer is no longer present on a top surface of the fin structure 110, but the isolation structure 122 remains disposed between adjacent fin structures 110 and dummy fin structures 140. The isolation layer 400 may be etched using an anisotropic etch (e.g., HF etch, buffered HF etch, etc.). Slight over etching may be performed such that a top surface 123 of the isolation structure 122 has a curved or concave profile from a top surface of the fin structure 110 to an adjacent surface of the dummy fin structure 140. In some embodiments, a height of the isolation structures 122 may be smaller than a height of the adjacent fin structures 110. In other embodiments, the height of the isolation structures 122 may be about the same as a height of the adjacent fin structures 110.

At operation 208, a dummy gate dielectric layer (e.g., the dummy gate dielectric layer 150) is formed on a top surface of a topmost channel layer of the plurality of channel layers (e.g., the channel layers 120) of the fin structure (e.g., the fin structure 110). At operation 210, one or more dummy gate structures (e.g., dummy gate structure 106) is formed on a top surface of the dummy gate dielectric layer (e.g., the dummy gate dielectric layer 150) over the fin structure (e.g., the fin structure 110), such that the dummy gate structure extends along a second direction perpendicular to the first direction. Corresponding to operations 208-210, FIG. 4A is a cross-sectional view of the semiconductor device 300 cut along a direction along which the fin structure 110 extends (e.g., cross-section X-X in FIG. 1), and FIG. 4B is a cross-sectional view of the semiconductor device 300 cut along a direction along which the dummy gate structure 106 of the semiconductor device 300 extends (e.g., cross-section Y-Y in FIG. 1) after formation of the dummy gate dielectric layer 150 and the dummy gate structure 106.

As previously described, existing technologies generally a deposit a buffer layer on the fin structure before depositing the dummy gate dielectric layer. In contrast, the dummy gate dielectric layer of method 200 is deposited directly over the top surface of the topmost channel layer 120 of the fin structure 110, which also obviates the need for an etching step for removing the buffer layer. This reduces fabrication complexity and manufacturing cost.

The dummy gate dielectric layer 150 may be formed from SiO or any other suitable material. For example, as shown in FIGS. 4A-4B, the dummy gate dielectric layer 150 is formed over the fin structure 110 as shown in FIG. 4A such that dummy gate dielectric layer 150 is disposed over the topmost channel layer 120, and is also disposed on a sidewall of the dummy fin structure 140, more particularly, on the sidewalls and top surface of the upper portion 142 of the dummy fin structure 140. In some embodiments, the lower portion 144 of the dummy fin structure 140 that is overlaid or protected by the upper portion 142 (e.g., a high-k dielectric la12yer) can be formed to produce a substantially planar top surface shared by the fin structure 110, the upper portion 142, and the lower portion 144. As used herein, the term "substantially planar" refers to a structure when the deviation of the structure from a plane is within the statistical atomic level variations inherent within semiconductor processing methods known in the art. In some embodiments, the dummy gate dielectric layer 150 may be formed over such a substantially planar top surface. Moreover, a portion of the dummy gate dielectric layer 150 is also disposed on the top surface 123 of the isolation structure 122 and has the same profile as the top surface 123 of the isolation structure 122, i.e., a curved or concave profile, as described in further detail with respect to FIG. 5. Thus, the dummy gate dielectric layer 150 is continuous from over the top surface of the fin structure 110, the top surface 123 of the isolation structure 122, and the sidewalls and top surface of the dummy fin structure 140.

In some other embodiments, the dummy gate dielectric layer 150 may be formed over only a top surface of the fin structure 110. The dummy gate dielectric layer 150 may be formed by a deposition process, such as CVD (e.g., PECVD, high aspect ratio process (HARP), or combinations thereof) process, ALD process, another applicable process, or combinations thereof.

For example, as shown in FIGS. 4A-4B, the dummy gate structure 106 may be placed where respective active (e.g., metal) gate structures are later formed, in various embodiments. Each of the dummy gate structures 106 may be disposed over a respective portion of fin structure 110, for example over the topmost channel layer 120 and top surface of any portion of the sacrificial layer material that is adjacent to the fin structure 110 (FIG. 4B), with the dummy gate dielectric layer 150 interposed therebetween. Such an overlaid portion of the fin structure 110 can be later formed as a conduction channel, which includes at least portions of the channel layers 120. Further, the dummy gate structures 106 can each be replaced with an active gate structure (e.g., active gate structure 130) to wrap around each of the portions of the channel layers 120.

The dummy gate structure 106 can each include one or more silicon-based materials such as, for example, polysilicon, multilayers thereof, or combinations thereof, and may be deposited. In some embodiments, the dummy gate structures 106 can each include one or more metal-based materials such as, for example, cobalt, tungsten, hafnium oxide, aluminum oxide, or combinations thereof, and may be deposited.

To form the dummy gate structure 106, a dummy gate layer including dummy gate material may be deposited over the fin structure 110 on top of the dummy gate dielectric layer 150. The dummy gate layer may be patterned using a soft mask, a photolithography mask, or hard mask to form the dummy gate structures 106 extending along the second direction as shown in FIGS. 4A-4B. In some embodiments, the dummy gate structures 106 may be defined using a high selectivity etch (e.g., a high selectivity RIE or DRIE etch) using an etch gas, a passivation gas, and a dilute gas. For example, the high selectivity etch may include a plasma etching process (including radical plasma etching, remote plasma etching, and other suitable plasma etching processes), including etch gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof, used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with dilute gases such as argon (Ar), helium (He), neon (Ne), and other suitable dilutive gases and combinations thereof to form the dummy gate structures 106. As a non-limiting example, a source power of 10 Watts to 4,000 Watts, a bias power of 0 watts to 3,000 watts, a pressure of 1 millitorr to 800 torr, and an etch gas flow of 20 standard cubic centimeters per minute (sccm) to 3,000 sccm may be used in the etching process.

Figure 5:
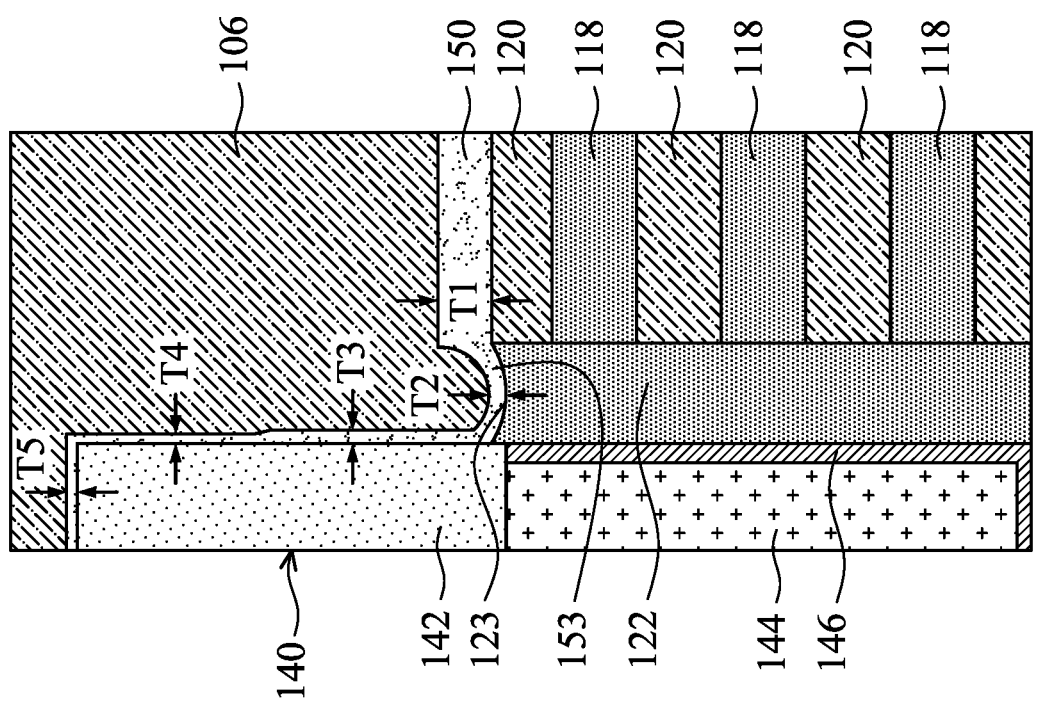

Due to deposition of the dummy gate dielectric layer 150 directly on the topmost channel layer 120, the top surface 123 of the isolation structure 122, as well as sidewalls and top surface of the dummy fin structure 140, the dummy gate dielectric layer 150 may have a unique profile beneath the dummy gate structure 106. For example, FIG. 5 shows a portion of the semiconductor device 300 indicated by the arrow A in FIG. 4B, showing the profile of the dummy gate dielectric layer 150 under the dummy gate structure 106. As shown in FIG. 5, the dummy gate dielectric layer 150 has a first thickness T1 at a location on the top surface of the topmost channel layer 120 that is greater than or equal to a second thickness T2 of a portion 153 of the dummy gate dielectric layer 150 that is disposed on the top surface 123 of the isolation structure 122. In some embodiments, each of the first thickness T1 and the second thickness T2 are in a range of 2 nm to 5 nm, inclusive. In other embodiments the second thickness T2 may be smaller than the first thickness T1. As previously described, the portion 153 has a curved profile that mimics the profile of the top surface of the isolation structure 122. For example, a bottom surface of the portion 153 that contacts the top surface 123 of the isolation structure 122 has a convex profile, and a top surface of the portion 153 has a concave profile.

In some devices, a buffer layer is deposited before depositing a dummy gate dielectric layer, and a dummy gate dielectric layer is deposited on top of the buffer layer. In such devices, the buffer layer induces a different growth profile of the dummy gate dielectric layer such that the dummy gate dielectric layer increases in thickness from a bottom surface to top surface of a dummy fin structure. In contrast, the dummy gate dielectric layer 150 is deposited directly on the top surface of the fin structure 110 and the sidewalls of the dummy fin structure 140, which induces a different growth profile of the dummy gate dielectric layer 150 such that the dummy gate dielectric layer 150 has an overall smaller thickness than devices including a buffer layer, and decreases in thickness from the bottom surface to the top surface of the upper portion 142 of the dummy fin structure 140. For example, as shown in FIG. 5, the dummy gate dielectric layer 150 may have a third thickness T3 at location on the sidewall of the upper portion 142 of the dummy fin structure 140 that is proximate to the lower portion 144 of the dummy fin structure 140, which is larger than a fourth thickness T4 of the dummy gate dielectric layer 150 at a location that is distant from the lower portion of the dummy fin structure 140. In some embodiments, the third thickness T3 is smaller than the second thickness T2. The third thickness T3 may be in a range of 1 nm to 3 nm, inclusive. The dummy gate dielectric layer 150 may also have a fifth thickness T5 at a location on the top surface of the dummy fin structure 140, i.e., the top surface of the upper portion 142, which is smaller than the first thickness T1. In some embodiments, the fifth thickness T5 may also be smaller than the third thickness T3. In some embodiments, the fifth thickness T5 may be equal to the fourth thickness T4, for example, in a range of 0.5 nm to 1 nm, inclusive. In other embodiments, the fifth thickness T5 may be smaller than the fourth thickness T4.

At operation 212, a pair of gate spacers (e.g., the gate spacers 162, and in some embodiments, additionally the intermediate gate spacers 164) extending along opposite sidewalls of the dummy gate structure (e.g., the dummy gate structure 106) are formed. In some embodiments, an intermediate gate spacer (e.g., the intermediate gate spacer 164) may be disposed on the dummy gate structure before disposing the gate spacer thereon such that the intermediate gate spacer is interposed between the gate spacer and the dummy gate structure. In some embodiments, the gate spacer may be a bilayer gate spacer with the intermediate gate spacer being one layer of the gate spacer. At operation 214, the dummy gate dielectric layer (e.g., the dummy gate dielectric layer 150) is patterned using the dummy gate structure (e.g., the dummy gate structure 106) and the gate spacers as a mask. At operation 216, portions of the one or more fin structure are removed. At operation 218, inner spacers (e.g., the inner spacers 114) are formed. At operation 220, source/drain structures (e.g., the source/drain structures 112) are formed.

Corresponding to operations 212-220, FIG. 6A is a cross-sectional view of the semiconductor device 300 cut along a direction along which the fin structure 110 extends (e.g., cross-section X-X in FIG. 1), and FIG. 6B is a cross-sectional view of the semiconductor device 300 cut along a direction along which the dummy gate structure 106 of the semiconductor device 300 extends (e.g., cross-section Y-Y in FIG. 1), once the source/drain structures 112 have been formed.

To form the gate spacer 162, a blanket gate spacer may be formed over the dummy gate structures 106, and the dummy gate dielectric layer 150. As such, the blanket gate spacer can overlay a top surface of the dummy gate structures 106, extend along the sidewall (of the dummy gate structure 106), at least a portion the sidewall of the patterned dummy gate dielectric layer 150 and may also be disposed on a top surface of the dummy gate dielectric layer 150. The blanket gate spacer may be (e.g., conformally) formed as a relatively thin layer, with a thickness ranging from about 2 angstroms (Å) to about 500 Å.

The blanket gate spacer can be formed as a combination of two conformal layers, for example, a first layer that forms the intermediate gate spacer 164 and a second layer that forms the gate spacer 162. Each of the conformal layers can line the top surface and sidewalls of the dummy gate structure 106, as well as top surface of the dummy gate dielectric layer 150. Since the gate spacer 162 is formed over the dummy gate dielectric layer 150, the dummy gate dielectric layer 150 is in contact with a bottom surface of the gate spacer 162 and the top surface of the fin structure 110. It should be understood that the gate spacer 162 can be formed as a combination of any number of conformal layers, while remaining within the scope of the present disclosure. For example, the gate spacer 162 may be formed as a single conformal layer, i.e., the intermediate gate spacer 164 may be excluded.

In some embodiments, each of the gate spacer 162 and the intermediate gate spacer 164 may include a dielectric material, for example, SiN, SiON, SiCN, SiC, SiOC, SiOCN, the like, or combinations thereof. The conformal layer may be formed using ALD, LPCVD, PECVD, or any other suitable technique, for example. Each of the conformal layers may have a thickness ranging from about 1 angstroms (Å) to about 250 Å. The gate spacer 162 and the intermediate gate spacer 164 is formed by removing (e.g., through anisotropic etching) portions of the blanket spacer overlaying the top surface of the dummy gate structures 106 and a portion of the top surface of the dummy gate dielectric layer 150 between adjacent dummy gate structures 106.

To pattern the dummy gate dielectric layer 150 (operation 214), portions of the dummy gate dielectric layer 150 that are not overlaid by the dummy gate structures 106 and the gate spacer 162 are removed by an etching process, which can include one or more steps. By removing such portions of the dummy gate dielectric layer 150, the patterned dummy gate dielectric layer 150 is formed and the top surface of the topmost channel layer 120 that is located between adjacent dummy gate structures 106 (FIG. 6A) is exposed, but the dummy gate dielectric layer 150 remains interposed between the dummy gate structures 106 and the topmost channel layer 120 (FIG. 6B).

The etching process for patterning the dummy gate dielectric layer 150 may include a plasma etching process, which can have a certain amount of anisotropic characteristic. For example, the dummy gate dielectric layer 150 may be etched using a plasma etching process (including radical plasma etching, remote plasma etching, and other suitable plasma etching processes), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the dummy gate dielectric layer 150. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. In some embodiments, the high selectivity etch used to form the dummy gate structure 106 may also be suitable for patterning the dummy gate dielectric layer 150 such that dummy gate structures 106 is formed and the dummy gate dielectric layer 150 is patterned in the same step.

In another example, the dummy gate dielectric layer 150 may be etched using a wet etching process, which can have a certain amount of isotropic characteristic, in combination with, or instead of the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to form the patterned dummy gate dielectric layer 150.

In some embodiments, patterning of the dummy gate dielectric layer 150 after forming the gate spacer 162 may cause a sidewall of the dummy gate dielectric layer 150 below the dummy gate structure 106 to have curved or contoured profile because of the absence of a buffer layer therebeneath. A portion of the gate spacer 162 may extend axially downwards of the dummy gate structure 106 such that the portion of the gate spacer 162 is located along a sidewall of a portion of the patterned dummy gate dielectric layer 150 that is below the dummy gate structure 106. Because the gate spacer 162 includes a conformally coated layer, the portion of the gate spacer 162 in contact with a sidewall of the dummy gate dielectric layer 150 follows the same contour.

Figure 11:
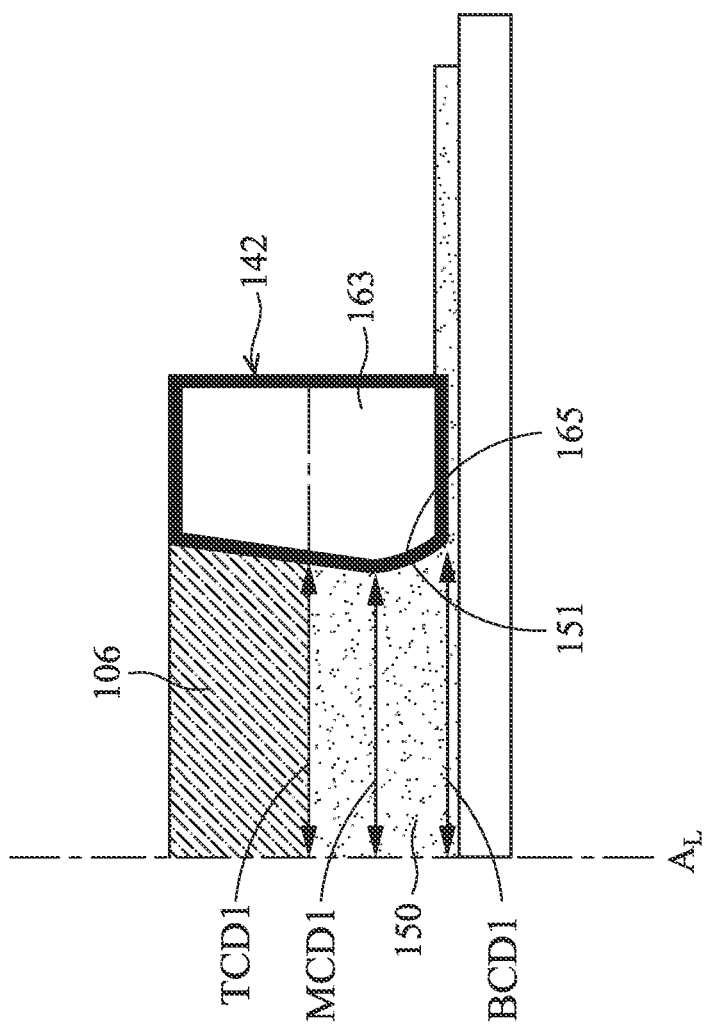

For example, FIG. 11 is a cross-sectional view of the semiconductor device 300 cut along a direction along which the dummy gate structure 106 of the semiconductor device 300 extend (e.g., cross-section Y-Y in FIG. 1), and showing the profile of a portion 163 of the gate spacer 162 that is in contact with a sidewall 151 of the dummy gate dielectric layer 150. In some embodiments, a sidewall 165 of the portion 163 of the gate spacer 162 that is proximate to the dummy gate structure 106 defines a curvature such that each of a first radial distance TCD1 measured from a longitudinal axis $A_L$ that passes through a center of the dummy gate structure 106 to the sidewall 165 along a top surface of the dummy gate dielectric layer 150, and a second radial distance BCD1 measured from the longitudinal axis $A_L$ to the sidewall 165 along a bottom surface of the portion 163 of the gate spacer 162, are greater than a third radial distance MCD1 measured from the longitudinal axis $A_L$ to a location on the sidewall 165 of the portion 163 between the top surface of the dummy gate dielectric layer 150 and the bottom surface of the portion of the gate spacer 162. In some embodiments the first radial distance TCD1 is approximately equal to the second radial distance BCD 1 (e.g., within +1 nm of each other).

Referring again to FIGS. 6A-6B, corresponding to operation 216 the dummy gate structures 106 and the gate spacer 162 can collectively serve as a mask to etch the non-overlaid portions of the fin structure 110, which results in the fin structure 110 having one or more alternatingly stacks including remaining portions of the channel layers 120 and the sacrificial layers 118. As a result, along the vertical direction, newly formed sidewalls of each of the fin structures 110 are aligned with sidewalls of the dummy gate structure 106.

Etching of the non-overlaid portions of the fin structure 110 can also cause etching of lateral edges of the sacrificial layers 118 that are perpendicular to the second direction. As shown in FIG. 6A and corresponding to operation 218, the inner spacers 114 are formed along respective etched ends of the sacrificial layers 118. In some embodiments, to form the inner spacers 114, respective end portions of each of the sacrificial layers 118 may first be removed, as described above. The end portions of the sacrificial layers 118 can be removed (e.g., etched) using a "pull-back" process to pull the sacrificial layers 118 back by an initial pull-back distance. Although in the illustrated embodiment of FIG. 6A, the etched ends of each of the sacrificial layers 118 are approximately vertical (e.g., in parallel with the sidewalls of the dummy gate structures 106), it should be understood that the etched ends may be curved inwardly or outwardly. In an example where the sacrificial layers 118 include Si, and the channel layers 120 include $Si_{1-x}Ge_x$, the pull-back process may include an isotropic etch process (e.g., a $CF_4$ plasma etch), which etches Si without attacking SiGe. As such, the channel layers 120 may remain intact during this process.

Next, the inner spacers 114 can be formed along the etched ends of each of the sacrificial layers 118. Thus, the inner spacers 114 (e.g., their respective inner sidewalls) may follow the profile of the etched ends of the sacrificial layers 118. In some embodiments, the inner spacers 114 can be formed conformally by chemical vapor deposition (CVD), or by monolayer doping (MLD) of nitride followed by spacer RIE. The inner spacers 114 can be deposited using, e.g., a conformal deposition process and subsequent isotropic or anisotropic etch back to remove excess spacer material on the sidewalls of the stacks of the fin structure 110 and on a surface of the substrate 102. A material of the inner spacers 114 can be formed from the same or different material as the dummy gate structures 106. For example, the inner spacers 114 can be formed of SiN, SiOCN, SiCN, SiON, or any other type of dielectric material (e.g., a dielectric material having a dielectric constant k of less than about 5) appropriate to the role of forming an insulating gate sidewall spacers of transistors.

Next, the source/drain structures 112 are formed, as shown in FIG. 6A. The source/drain structures 112 may be formed using an epitaxial layer growth process on exposed ends of each of the channel layers 120 and the inner spacers 114 over the substrate 102 adjacent to the fin structure 110. In some embodiments, a bottom surface of the source/drain structures 112 may be leveled with the top surface of an isolation structure (not shown) that embeds a lower portion of the fin structure 110. In some other embodiments, the bottom surface of the source/drain structures 112 may be lower than the top surface of such an isolation structure. On the other hand, in some embodiments, a top surface of the source/drain structures 112 may be higher than a top surface of the topmost channel layer 120, as shown in FIG. 6A. In some other embodiments, the top surface of the source/drain structures 112 may be leveled with or lower than the top surface of the topmost channel layer 120.

The source/drain structures 112 are electrically coupled to the respective channel layers 120, for example, via contact with lateral edges of each of the plurality of channel layers 120. In various embodiments, the channel layers 120 may collectively function as the conduction channel of the semiconductor device 300, for example, a GAA FET. It should be noted that at this stage of fabrication, the semiconductor device 300 is not yet complete.

In-situ doping (ISD) may be applied to form doped source/drain structures 112, thereby creating the junctions for the semiconductor device 300. N-type and p-type FETs are formed by implanting different types of dopants to selected regions (e.g., the source/drain structures 112) of the device to form the junction(s). N-type devices can be formed by implanting arsenic (As) or phosphorous (P), and p-type devices can be formed by implanting boron (B).

At operation 222, an ILD (e.g., ILD 160) is formed over the source/drain structures (e.g., the source/drain structures 112). At operation 224, the one or more dummy gate structures (e.g., the dummy gate structures 106) are removed. Corresponding to operations 222-224, FIG. 7A is a cross-sectional view of the semiconductor device 300 cut along a direction along which the fin structure 110 extends (e.g., cross-section X-X in FIG. 1), and FIG. 7B is a cross-sectional view of the semiconductor device 300 cut along a direction along which the dummy gate structure 106 extends (e.g., cross-section Y-Y in FIG. 1), after the source/drain structures 112 have been formed.

For example, upon forming the source/drain structures 112, the ILD 160 can be formed by depositing a dielectric material in bulk over the partially formed semiconductor device 300 (e.g., a GAA FET device), and polishing the bulk oxide back (e.g., using CMP) to the level off the dummy gate structures 106. The dielectric material of the ILD 160 may include SiO, phosphosilicate glass (PSG), borosilicate glass (BSG), boron-doped phosphosilicate Glass (BPSG), undoped silicate glass (USG), or combinations thereof.

Figure 7B:
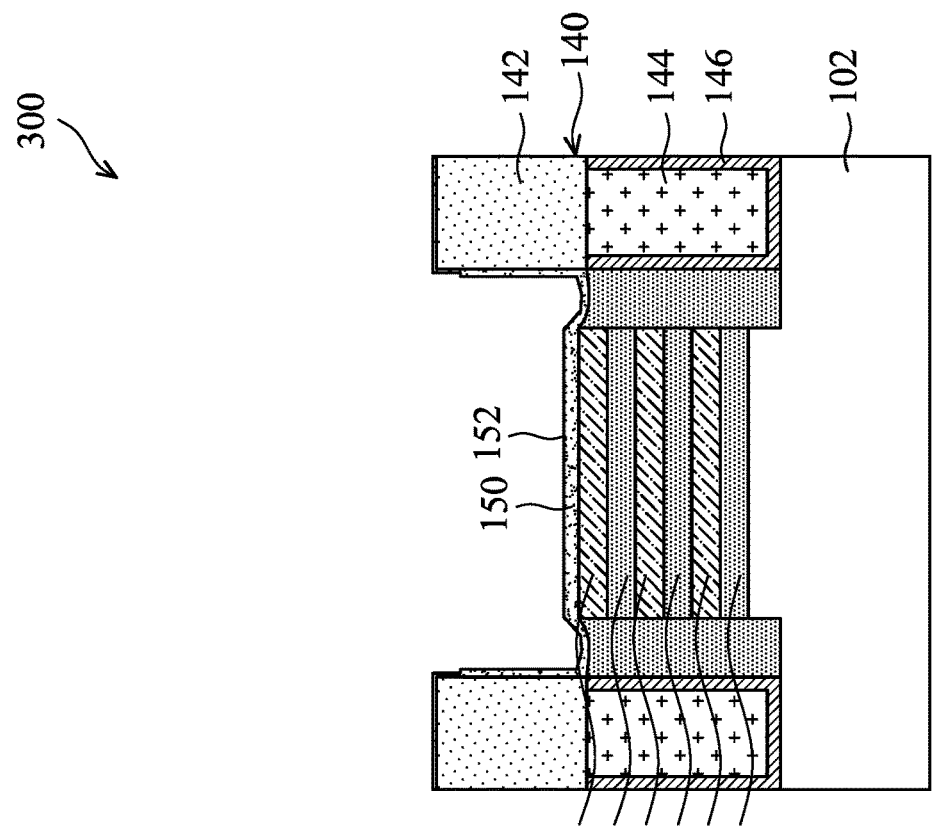
Figure 7A:
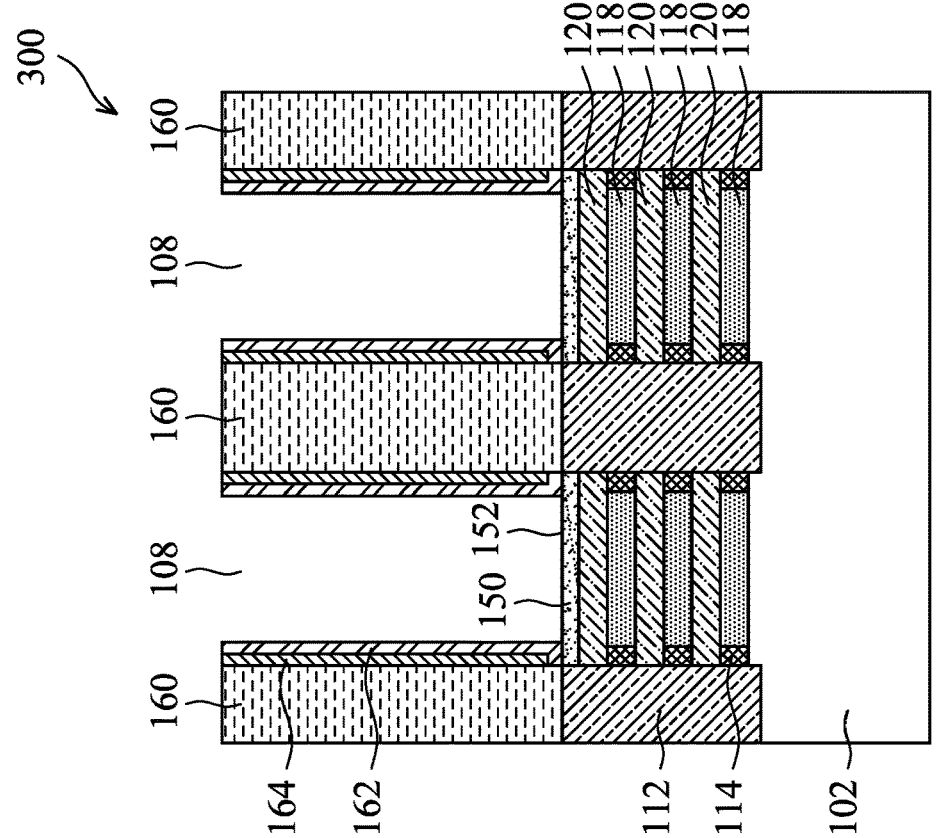

Corresponding to operation 224, FIGS. 7A-7B show the semiconductor device 300 with the dummy gate structures 106 removed. For example, subsequent to forming the ILD 160 (FIG. 7A), the dummy gate structures 106 are removed, thereby forming gate trenches 108, respectively. The dummy gate structures 106 can be removed by a known etching process, e.g., a wet etch, ME, DRIE, or chemical oxide removal (COR). After the removal of the dummy gate structures 106 (forming the gate trenches 108), a top surface 152 of the patterned dummy gate dielectric layer 150 that is disposed over the topmost channel layer 120, is exposed. Although not shown in the cross-sectional view of FIGS. 7A and 7B, it should be appreciated that in addition to the top surface 152 of the patterned dummy gate dielectric layer 150, the sidewalls of each of the channel layers 120 and the sacrificial layers 118 (facing the longitudinal direction along which the dummy gate structures 106 extended) may be exposed, in some embodiments.

At operation 226, the patterned dummy gate dielectric layer (e.g., the dummy gate dielectric layer 150) is etched. At operation 228, the sacrificial layers (e.g., the sacrificial layers 118) are removed. At step 230, one or more active gate structures (e.g., the active gate structure 130) are formed.

Figures 8A, 8B:
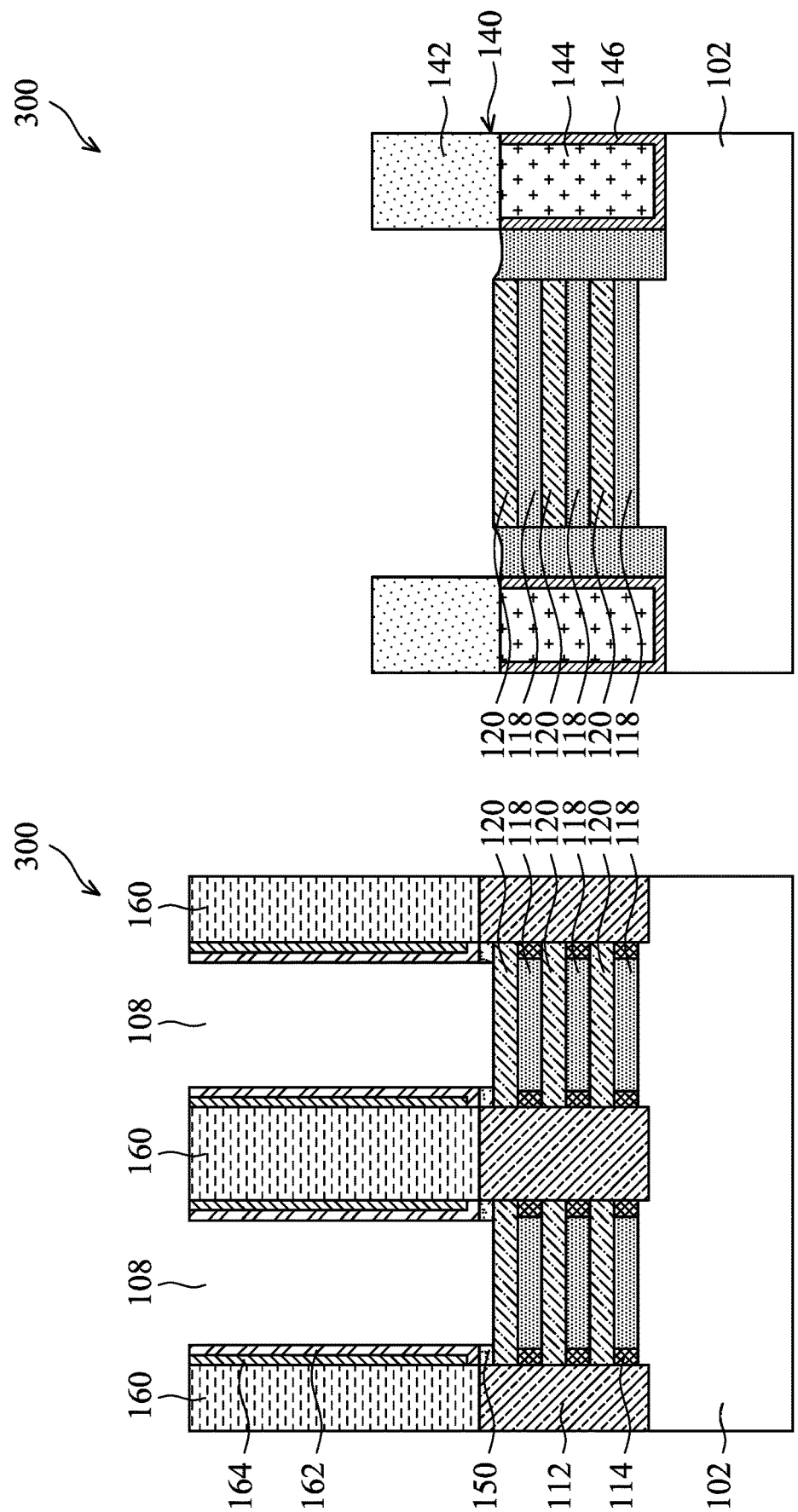

Corresponding to operation 226, FIG. 8A is a cross-sectional view of the semiconductor device 300 cut along a direction along which the fin structure 110 extends (e.g., cross-section X-X in FIG. 1), and FIG. 8B is a cross-sectional view of the semiconductor device 300 cut along a direction along which the dummy gate structure 106 of the semiconductor device 300 extended (e.g., cross-section Y-Y in FIG. 1), after the dummy gate dielectric layer 150 has been etched.

The patterned dummy gate dielectric layer 150 may be removed to further extend the gate trenches 108 by an etching process. Such an etching process may stop when the topmost channel layer 120 of the fin structure 110 is exposed, which will be discussed in further detail below. In some embodiments, the portions of the dummy gate dielectric layer 150 at lateral edges thereof that extend in a direction parallel to the second direction in which the gate trenches 108 extend, are disposed beneath the gate spacer 162 and are protected from being etched by the gate spacer 162. In such embodiments, after etching, the dummy gate dielectric layer 150 is disposed between the gate spacer 162 and the topmost channel layer 120 of plurality of channel layers 120 such that the dummy gate dielectric layer 150 is in contact with a top surface of the topmost channel layer 120, bottom surface of the gate spacer 162, and contacts a sidewall of the active gate structure 130 that is later formed in the gate trenches 108. The dummy gate dielectric layer 150 may have a final thickness in the vertical direction in a range of 1 nm to 10 nm, inclusive.

As previously described, the method 200 excludes the use of a buffer layer between the dummy gate dielectric layer 150 and the topmost channel layer 120. Therefore, once the dummy gate dielectric layer 150 is removed from the top surface of the topmost channel layer 120, an additional etching step is not needed for removing the buffer layer. This reduces manufacturing complexity and fabrication cost. Moreover, the etch process used to etch the patterned dummy gate dielectric layer 150 may have very high etch selectivity relative to the material forming the channel layer 120, such that over etching the dummy gate dielectric layer 150 causes de minimis or no etching of the topmost channel layer 120 disposed therebeneath. Therefore, each of the plurality of channel layers 120 has about the same thickness, for example, in a range of 6 nm to 20 nm, inclusive, after etching of the patterned dummy gate dielectric layer 150.

The etching process used to etch the dummy gate dielectric layer 150 can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to stop the etching when the topmost channel layer 120 is exposed. As a non-limiting example, a source power of 10 watts to 3,000 watts, a bias power of 0 watts to 3,000 watts, a pressure of 1 millitorr to 5 torr, and an etch gas flow of 0 sccm to 5,000 sccm may be used in the etching process used to etch the dummy gate dielectric layer 150. However, it is noted that source powers, bias powers, pressures, and flow rates outside of these ranges are also contemplated.

In another example, the etching process can include a wet etching process, which can have a certain amount of isotropic characteristic, in combination with the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to stop the etching when the topmost channel layers 120 are exposed.

In some embodiments, in which an anisotropic etch is used to etch the patterned dummy gate dielectric layer 150, removal of the dummy gate dielectric layer 150 from a top surface of the topmost channel layer 120 may still leave portions of the dummy gate dielectric layer 150 disposed on sidewalls of the dummy fin structure 140. In such embodiment, the remaining portion of the dummy gate dielectric layer 150 disposed on sidewalls of the dummy fin structure 140, for example, sidewalls of the upper portion 142 of the dummy fin structure 140 that extend along the direction in which the dummy fin structure 140 extends. For example, as shown in FIG. 10 and as previously described, the dummy gate dielectric layer 150 has a larger thickness at a location proximate to a bottom surface of the upper portion 142 of the dummy fin structure 140 than at a location proximate to a top surface of the upper portion 142 of the dummy fin structure 140. Therefore, the first width BCD an measured from an outer surface of one side of the dummy gate dielectric layer 150 to the outer surface on an opposite side of the dummy gate dielectric layer 150 at the location proximate to the bottom surface of the upper portion 142, is larger than the second width TCD measured from the outer surface of one side of the dummy gate dielectric layer 150 to the outer surface on the opposite side of the dummy gate dielectric layer 150 at the location proximate to the top surface of the upper portion 142, such that the dummy gate dielectric layer 150 inwards from a bottom surface to a top surface of the upper portion 142.

Corresponding to operations 228-230, FIG. 9A is a cross-sectional view of the semiconductor device 300 cut along a direction along which the fin structure 110 extends (e.g., cross-section X-X in FIG. 1), and FIG. 9B is a cross-sectional view of the semiconductor device 300 cut along a direction along which the active gate structure 130 of the semiconductor device 300 extends (e.g., cross-section Y-Y in FIG. 1), after the sacrificial layers 118 have been removed and the active gate structure 130 has been formed.

Subsequent to etching the patterned dummy gate dielectric layer 150, the isolation structures 122 may be removed (e.g., using a similar etching process used to initially form the isolation structures 122, as previously described herein, and then the sacrificial layers 118 are removed by applying a selective etch (e.g., a hydrochloric acid (HCl)), while leaving the channel layers 120 intact. After the removal of the sacrificial layers 118, respective bottom surface and/or top surface of each of the channel layers 120 may be exposed by further extending the gate trenches 108, in accordance with various embodiments. For example, upon removing the channel layers 120, the gate trenches 108 can be further extended from a region that is above the topmost channel layers 120 to a region that is below the topmost channel layers 120. Consequently, the bottom surface of each of the topmost channel layers 120 can be exposed, and the respective top and bottom surfaces of each of the rest of the channel layers 120 can also be exposed.

Continuing to refer to FIGS. 9A-9B, the active gate structure 130 is formed in the extended gate trenches 108 (FIGS. 8A-8B) by filling a gate dielectric and/or a gate metal, while leaving other components (e.g., the gate spacer 162, the remaining patterned dummy gate dielectric layer 150, the inner spacer 114) substantially intact, and thus, the active gate structures 130 can inherit the dimensions and profiles of the gate trenches 108, respectively.

For example, in FIGS. 9A-9B, the active gate structure 130 can include an upper portion and a lower portion that may be separated by the topmost channel layer 120. The upper portion may be surrounded by the gate spacer 162, and the lower portion may wrap around each of the channel layers 120. Specifically, a first sidewall of the upper portion of the active gate structure 130, which extends in the direction in which the active gate structure 130 extends, can extend along the substantially vertical sidewall of the gate spacer 162 and at least a portion of a vertical sidewall of the remaining patterned dummy gate dielectric layer 150 (FIG. 9A), and a second sidewall of upper portion perpendicular to the first sidewall extends along a sidewall of the dummy fin structure 140 (FIG. 9B). The upper portion of the active gate structure 130 may also be disposed over the dummy fin structure 140.

The active gate structure 130 may be formed from a high-k dielectric material, in some embodiments. Although the active gate structure 130 shown in FIGS. 9A-9B is shown as a single layer, in other embodiments, the active gate structure 130 can be formed as a multi-layer stack (e.g., including a gate dielectric layer and a gate metal layer), while remaining within the scope of the present disclosure. The active gate structure 130 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The active gate structure 130 can be deposited using any suitable method, including, for example, molecular beam deposition (MBD), atomic layer deposition (ALD), PECVD, and the like. In some embodiments, the active gate structure 130 may optionally include a substantially thin oxide (e.g., $SiO_x$) layer, which may be a native oxide layer formed on the surface of each of the channel layers 120.

In some embodiments in which active gate structure 130 includes a gate dielectric and a gate metal, the gate metal can wrap around each of the channel layers 120 with the gate dielectric disposed therebetween. Specifically, the gate metal can include a number of gate metal sections abutted to each other along the vertical direction. Each of the gate metal sections can extend not only along a horizontal plane (e.g., the plane expanded by the first direction and the second direction), but also along the vertical direction. As such, two adjacent ones of the gate metal sections can adjoin together to wrap around a corresponding one of the channel layers 120, with the gate dielectric disposed therebetween.

Figure 12:
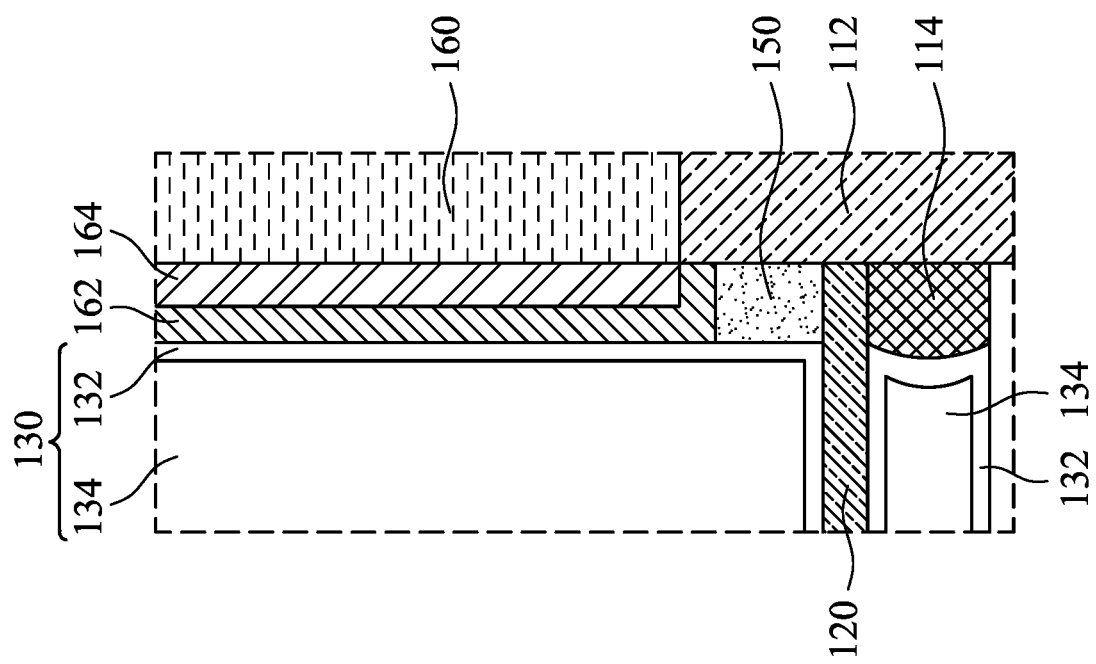

For example, FIG. 12 is side cross-sectional view of a portion of the semi-conductor device 300 indicated by the arrow A in FIG. 9A. As shown in FIG. 12, the active gate structure 130 includes a gate dielectric 132 (e.g., formed from a high-k dielectric layer) and a gate metal 134, in some embodiments. The gate dielectric 132 can wrap around each of the channel layers 120. The gate dielectric 132 can wrap around each of the channel layers 120, with the gate dielectric 134 disposed therebetween. In some embodiments, the inner spacers 114 may have a U-shaped profile, for example, a convex profile at surface thereof that faces the active gate structure 130, as previously described. This results in a surface of the gate dielectric 132 in contact with the surface of the inner spacer 114 may also have a corresponding U-shaped profile, for example, a concave profile.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process. In some embodiments, metals such as Cu, W, Co, Zr, may also be deposited over the work function metals to form the active gate structure 130.

In some embodiments, a semiconductor device includes a plurality of channel layers vertically separated from one another. The semiconductor device includes an active gate structure comprising a lower portion and an upper portion, wherein the lower portion wraps around each of the plurality of channel layers. The semiconductor device also includes a gate spacer extending along a sidewall of the upper portion of the active gate structure, the gate spacer having a bottom surface. The semiconductor device also includes a dummy gate dielectric layer disposed between the gate spacer and a topmost channel layer of plurality of channel layers, the dummy gate dielectric layer being in contact with a top surface of the topmost channel layer, the bottom surface of the gate spacer, and the sidewall of the active gate structure.

In some embodiments, a method of making a semiconductor device includes forming a fin structure that extends along a first direction and includes a plurality of sacrificial layers and a plurality of channel layers alternately stacked on top of one another. The method includes forming a dummy fin structure adjacent to the fin structure, the dummy fin structure having a lower portion and an upper portion. The method includes forming a dummy gate dielectric layer on a top surface of a topmost channel layer of the plurality of channel layers of the fin structure. The method includes forming a dummy gate structure on a top surface of the dummy gate dielectric layer over the fin structure, the dummy gate structure extending along a second direction perpendicular to the first direction. Moreover, the method includes patterning the dummy gate dielectric layer using the dummy gate structure as a mask. The dummy gate dielectric layer has a first thickness at a location on the top surface of the topmost channel layer that is greater than or equal to a second thickness of the dummy gate dielectric layer at a location that is interposed between the topmost channel layer and a sidewall of the upper portion of the dummy fin structure.

In some embodiments, a method of making a semiconductor device includes forming a fin structure that extends along a first direction and comprises a plurality of sacrificial layers and a plurality of channel layers alternately stacked on top of one another. The method includes forming a dummy gate dielectric layer on a top surface of a topmost channel layer of the plurality of channel layers of the fin structure. The method includes forming a dummy gate structure on a top surface of the dummy gate dielectric layer over the fin structure, the dummy gate structure extending along a second direction perpendicular to the first direction. The method includes forming a gate spacer extending along a sidewall of the dummy gate structure, and patterning the dummy gate dielectric layer using the dummy gate structure as a mask. A portion of the gate spacer extends axially downwards of the dummy gate structure such that the portion of the gate spacer is located along a sidewall of a portion of the patterned dummy gate dielectric layer that is below the dummy gate structure. A sidewall of the portion of the gate spacer that is proximate to the dummy gate structure defines a curvature such that each of a first radial distance measured from a longitudinal axis that passes through a center of the dummy gate structure along a top surface of the dummy gate dielectric layer to the sidewall of the portion of the gate spacer and a second radial distance measured from the longitudinal axis to the sidewall of the portion of the gate spacer along a bottom surface of the portion of the gate spacer, are greater than a third radial distance measured from the longitudinal axis to a location on the sidewall of the portion of the gate spacer between the top surface of the dummy gate dielectric layer and the bottom surface of the portion of the gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of channel layers vertically separated from one another;
   an active gate structure comprising a lower portion and an upper portion, wherein the lower portion wraps around each of the plurality of channel layers;
   a gate spacer extending along a sidewall of the upper portion of the active gate structure, the gate spacer having a bottom surface; and
   a dummy gate dielectric layer disposed between the gate spacer and a topmost channel layer of the plurality of channel layers, the dummy gate dielectric layer being in contact with a top surface of the topmost channel layer, the bottom surface of the gate spacer, and the sidewall of the active gate structure.

2. The semiconductor device of claim 1, wherein the dummy gate dielectric layer has a thickness in a range of 1 nm to 10 nm.

3. The semiconductor device of claim 1, wherein each of the plurality of channel layers has about the same thickness.

4. The semiconductor device of claim 3, wherein the thickness of each of the plurality of channel layers is in a range of 6 nm to 20 nm.

5. The semiconductor device of claim 1, further comprising a dummy fin structure interposed between a first set and a second set of the plurality channel layers, the lower portion of the active gate structure being also wrapped around the dummy fin structure, the dummy fin structure having a lower portion and an upper portion, the dummy gate dielectric layer being disposed on a sidewall of at least a portion of the upper portion of the dummy fin structure.

6. The semiconductor device of claim 5, wherein the dummy gate dielectric layer has a larger thickness at a location proximate to a bottom surface of the upper portion of the dummy fin structure than at a location proximate to a top surface of the upper portion of the dummy fin structure.

7. A method of making a semiconductor device, comprising:
- forming a fin structure that extends along a first direction and comprises a plurality of sacrificial layers and a plurality of channel layers alternately stacked on top of one another;
- forming a dummy fin structure adjacent to the fin structure, the dummy fin structure having a lower portion and an upper portion;
- forming a dummy gate dielectric layer on a top surface of a topmost channel layer of the plurality of channel layers of the fin structure;
- forming a dummy gate structure on a top surface of the dummy gate dielectric layer over the fin structure, the dummy gate structure extending along a second direction perpendicular to the first direction; and
- patterning the dummy gate dielectric layer using the dummy gate structure as a mask,
- wherein the dummy gate dielectric layer has a first thickness at a location on the top surface of the topmost channel layer that is greater than or equal to a second thickness of the dummy gate dielectric layer at a location that is interposed between the topmost channel layer and a sidewall of the upper portion of the dummy fin structure.

8. The method of claim 7, wherein each of the first thickness and the second thickness are in a range of 2 nm to 5 nm.

9. The method of claim 7, wherein the dummy gate dielectric layer is also disposed on a sidewall of the dummy fin structure.

10. The method claim 9, wherein the dummy gate dielectric layer has a third thickness at a location on the sidewall of the upper portion of the dummy fin structure that is proximate to the lower portion of the dummy fin structure, which is larger than a fourth thickness of the dummy gate dielectric layer at a location that is distant from the lower portion of the dummy fin structure.

11. The method of claim 10, wherein the third thickness is smaller than the second thickness.

12. The method of claim 11, wherein the third thickness is in a range of 1 nm to 3 nm.

13. The method of claim 11, wherein the dummy gate dielectric layer is also disposed on a top surface of the upper portion of the dummy fin structure, the dummy gate dielectric layer having a fifth thickness at a location on the top surface of the dummy fin structure, which is smaller than the first thickness.

14. The method of claim 7, further comprising:
- forming a gate spacer extending along a sidewall of the dummy gate structure; and
- forming an active gate structure by replacing the dummy gate structure.

15. The method of claim 14, wherein a portion of the gate spacer extends axially downwards of the dummy gate structure such that the portion of the gate spacer is located along a sidewall of a portion of the patterned dummy gate dielectric layer that is below the dummy gate structure.

16. The method of claim 15, wherein a sidewall of a portion of the gate spacer that is proximate to the dummy gate structure defines a curvature such that each of a first radial distance measured from a longitudinal axis that passes through a center of the dummy gate structure along a top surface of the dummy gate dielectric layer to the sidewall of the portion of the gate spacer and a second radial distance measured from the longitudinal axis to the sidewall of the portion of the gate spacer along a bottom surface of the portion of the gate spacer, are greater than a third radial distance measured from the longitudinal axis to a location on the sidewall of the portion of the gate spacer between the top surface of the dummy gate dielectric layer and the bottom surface of the portion of the gate spacer.

17. A method of making a semiconductor device, comprising:
- forming a fin structure that extends along a first direction and comprises a plurality of sacrificial layers and a plurality of channel layers alternately stacked on top of one another;
- forming a dummy gate dielectric layer on a top surface of a topmost channel layer of the plurality of channel layers of the fin structure;
- forming a dummy gate structure on a top surface of the dummy gate dielectric layer over the fin structure, the dummy gate structure extending along a second direction perpendicular to the first direction;
- forming a gate spacer extending along a sidewall of the dummy gate structure; and
- patterning the dummy gate dielectric layer using the dummy gate structure as a mask,
- wherein:
  - a portion of the gate spacer extends axially downwards of the dummy gate structure such that the portion of the gate spacer is located along a sidewall of a portion of the patterned dummy gate dielectric layer that is below the dummy gate structure, and
  - a sidewall of the portion of the gate spacer that is proximate to the dummy gate structure defines a curvature such that each of a first radial distance measured from a longitudinal axis that passes through a center of the dummy gate structure along a top surface of the dummy gate dielectric layer to the sidewall of the portion of the gate spacer and a second radial distance measured from the longitudinal axis to the sidewall of the portion of the gate spacer along a bottom surface of the portion of the gate spacer, are greater than a third radial distance measured from the longitudinal axis to a location on the sidewall of the portion of the gate spacer between the top surface of the dummy gate dielectric layer and the bottom surface of the portion of the gate spacer.

18. The method of claim 17, wherein the first radial distance is approximately equal to the second radial distance.

19. The method of claim 17, wherein the dummy gate structure is formed using a high selectivity etch using an etch gas, a passivation gas, and a dilute gas.

20. The method of claim 17, further comprising:
- prior to forming the dummy gate dielectric layer, forming a dummy fin structure adjacent to the fin structure, the dummy fin structure having a lower portion and an upper portion,
- wherein the dummy gate dielectric layer has a first thickness at a location on the top surface of the topmost channel layer that is greater than or a equal to a second thickness of the dummy gate dielectric layer at a location that is interposed between the topmost channel layer and a sidewall of the upper portion of the dummy fin structure.

* * * * *